US012119051B2

(12) United States Patent
Binfet et al.

(10) Patent No.: US 12,119,051 B2
(45) Date of Patent: Oct. 15, 2024

(54) MEMORY ARRAY RESET READ OPERATION

(71) Applicant: Micron Technology, Inc., Boise, ID (US)

(72) Inventors: Jeremy Binfet, Boise, ID (US); Mark Helm, Santa Cruz, CA (US); William Filipiak, Boise, ID (US); Mark Hawes, Boise, ID (US)

(*) Notice: Subject to any disclaimer, the term of this patent is extended or adjusted under 35 U.S.C. 154(b) by 195 days.

(21) Appl. No.: 17/884,861

(22) Filed: Aug. 10, 2022

(65) Prior Publication Data

US 2022/0383949 A1 Dec. 1, 2022

Related U.S. Application Data

(60) Continuation of application No. 16/896,750, filed on Jun. 9, 2020, now Pat. No. 11,423,976, which is a division of application No. 15/688,645, filed on Aug. 28, 2017, now Pat. No. 10,685,702.

(51) Int. Cl.
| | |
|---|---|
| *G11C 11/419* | (2006.01) |
| *G11C 7/08* | (2006.01) |
| *G11C 7/10* | (2006.01) |
| *G11C 7/20* | (2006.01) |
| *G11C 7/22* | (2006.01) |
| *G11C 16/20* | (2006.01) |
| *G11C 16/24* | (2006.01) |

(Continued)

(52) U.S. Cl.
CPC .............. *G11C 11/419* (2013.01); *G11C 7/08* (2013.01); *G11C 7/1015* (2013.01); *G11C 7/1072* (2013.01); *G11C 7/20* (2013.01); *G11C 7/227* (2013.01); *G11C 16/20* (2013.01); *G11C 16/24* (2013.01); *G11C 16/26* (2013.01); *G11C 16/0483* (2013.01); *G11C 2207/2281* (2013.01)

(58) Field of Classification Search
CPC ....... G11C 11/419; G11C 7/08; G11C 7/1015; G11C 7/1072; G11C 7/227
USPC ..................................... 365/230.05
See application file for complete search history.

(56) References Cited

U.S. PATENT DOCUMENTS

| | | |
|---|---|---|
| 7,898,865 B2 | 3/2011 | Baek et al. |
| 8,737,138 B2 | 5/2014 | Pio |
| 8,913,447 B2 | 12/2014 | Anderson et al. |

(Continued)

FOREIGN PATENT DOCUMENTS

| | | |
|---|---|---|
| CN | 101361136 A | 2/2009 |
| CN | 101461011 A | 6/2009 |

(Continued)

OTHER PUBLICATIONS

International Search Report and Written Opinion received for PCT Patent Application No. PCT/US18/47359, mailed on Dec. 7, 2018, 13 pages.

(Continued)

*Primary Examiner* — Sung Il Cho

(57) ABSTRACT

Systems, devices, and methods related to reset read are described. A reset read may be employed to initiate a transition of a portion of memory array into a first state or maintain a portion of memory array in a first state, such as a transient state. A reset read may provide a highly-parallelized, energy-efficient option to ensure memory blocks are in the first state. Various modes of reset read may be configured according to different input.

20 Claims, 13 Drawing Sheets

(51) Int. Cl.
*G11C 16/26* (2006.01)
*G11C 16/04* (2006.01)

(56) References Cited

U.S. PATENT DOCUMENTS

| | | | |
|---|---|---|---|
| 8,954,650 | B2 | 2/2015 | Belgal et al. |
| 9,036,423 | B2 | 5/2015 | Sundahl et al. |
| 9,293,209 | B2 | 3/2016 | Ahn et al. |
| 9,852,789 | B2 | 12/2017 | Mantegazza et al. |
| 9,997,246 | B2 | 6/2018 | Grunzke |
| 10,026,486 | B1 * | 7/2018 | Dutta ................ G11C 16/3459 |
| 2004/0168016 | A1 | 8/2004 | Roohparvar |
| 2007/0140012 | A1 | 6/2007 | Roohparvar |
| 2007/0263462 | A1 | 11/2007 | Roohparvar |
| 2010/0046289 | A1 | 2/2010 | Baek et al. |
| 2012/0127807 | A1 | 5/2012 | Pio |
| 2012/0327728 | A1 | 12/2012 | Anderson et al. |
| 2013/0073786 | A1 | 3/2013 | Belgal et al. |
| 2013/0086334 | A1 | 4/2013 | Schuetz |
| 2014/0063967 | A1 | 3/2014 | Ahn et al. |
| 2014/0092687 | A1 | 4/2014 | Sundahl et al. |
| 2015/0003169 | A1 | 1/2015 | Nam et al. |
| 2015/0318045 | A1 * | 11/2015 | Yun ........................ G11C 16/30 365/185.25 |
| 2016/0086673 | A1 | 3/2016 | Yamada |
| 2016/0155507 | A1 | 6/2016 | Grunzke |
| 2017/0125091 | A1 * | 5/2017 | Yoon ...................... G11C 16/20 |
| 2017/0186486 | A1 | 6/2017 | Mantegazza et al. |
| 2018/0059948 | A1 | 3/2018 | Lee et al. |
| 2018/0190363 | A1 | 7/2018 | Lee |
| 2018/0197619 | A1 | 7/2018 | Chen et al. |
| 2018/0260134 | A1 | 9/2018 | Li |
| 2018/0261296 | A1 * | 9/2018 | Choi ...................... G11C 16/08 |

FOREIGN PATENT DOCUMENTS

| | | |
|---|---|---|
| KR | 10-2015-0001400 A | 1/2015 |
| KR | 10-2017-0052392 A | 5/2017 |
| TW | 201721640 A | 6/2017 |
| TW | 201729350 A | 8/2017 |

OTHER PUBLICATIONS

IPO, "Office Action," issued in connection with ROC (Taiwan) Patent Application No. 107129733, dated Dec. 19, 2019 (27 pages with translation).

KIPO, "Notice of Reasons for Rejection," issued in connection with Korean Patent Application No. 10-2020-7008536, dated Jan. 27, 2021 (12 pages).

Chinese Patent Office, "Office Action," issued in connection with Chinese Patent Application No. 201880062025.0 dated Mar. 20, 2023 (19 pages) (8 pages of English Translation and 11 pages of Original Document).

* cited by examiner

MEMORY ARRAY RESET READ OPERATION

CROSS REFERENCE

The present application for patent is a continuation of U.S. patent application Ser. No. 16/896,750 by Binfet, et al., entitled "MEMORY ARRAY RESET READ OPERATION", filed Jun. 9, 2020, which is a divisional of U.S. patent application Ser. No. 15/688,645 by Binfet, et al., entitled "MEMORY ARRAY RESET READ OPERATION", filed Aug. 28, 2017, each of which is assigned to the assignee hereof and each of which is expressly incorporated by reference in its entirety herein.

BACKGROUND

The following relates generally to a system and a memory device and more specifically to a reset read operation on three-dimensional (3D) Not-AND (NAND) memory.

A system may include various kinds of memory devices and controllers that are coupled via one or more buses to manage information in numerous electronic devices such as computers, wireless communication devices, internet of things, cameras, digital displays, and the like. Memory devices are widely used to store information in such electronic devices. Information is stored by programing different states of a memory cell. For example, binary memory cells have two states, often denoted by a logic "1" or a logic "0." More than two states may be stored in a memory cell. To access the stored information, a component of the electronic device may read, or sense, the stored state in the memory devices. To store information, a component of the electronic device may write, or program, the state in the memory devices.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), 3-dimensional NAND (3D NAND) memory, and others. Memory devices may be volatile or non-volatile. Non-volatile memory cells, e.g., 3D NAND memory cells, may maintain their stored logic state for extended periods of time even in the absence of an external power source. Volatile memory cells, e.g., DRAM cells, may lose their stored state over time unless they are periodically refreshed by an external power source. 3D NAND memory devices may have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Such improvement of memory devices may lead to improved system performance. In some cases, however, a widening of threshold voltage distribution of memory cells may result in a reduced read window budget and increased bit error rate that may adversely impact system performance.

BRIEF DESCRIPTION OF THE DRAWINGS

The disclosure herein refers to and includes the following figures.

DETAILED DESCRIPTION

Figure 1:
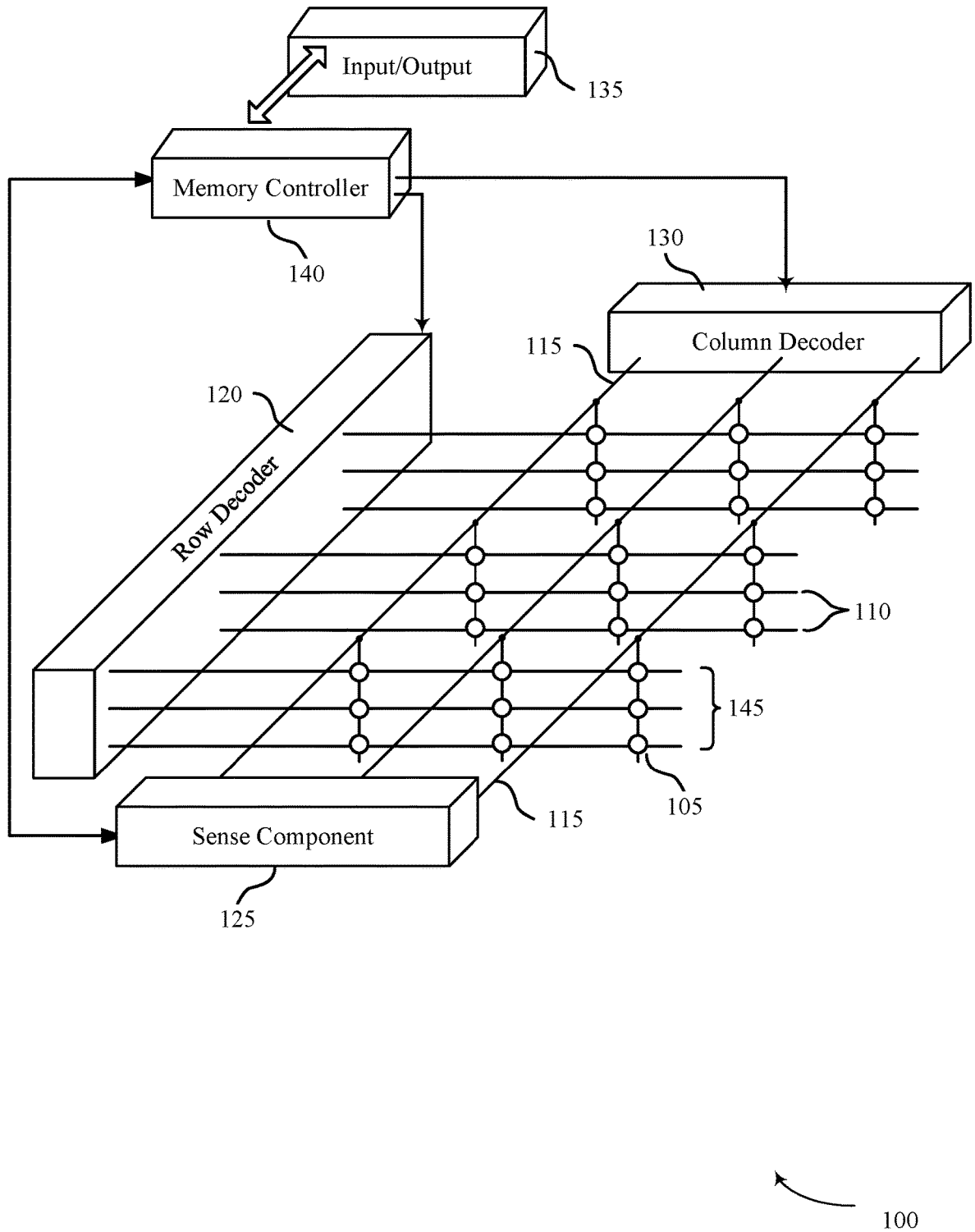
FIG. 1 shows an example memory device that support memory array reset read operation in accordance with various embodiments of the present disclosure.

A non-volatile memory devices may be employed in a system. Three-dimensional (3D) not-AND (NAND) memory technology may be employed in such non-volatile memory devices and may provide high density memory cells at a competitive cost. 3D NAND memory devices may be well suited for storage of sequential data such as pictures, video, audio, or personal computer (PC) data. 3D NAND memory devices may, however, have defective blocks and require error-correction code (ECC) operations to maintain data integrity. Performance of 3D NAND memory devices in a system may affect overall system performance. For instance, when a variation in raw bit error rate (RBER) causes re-read triggers to achieve an ECC correctible solution, the system may slow significantly. Maintaining a wide read window budget (RWB) and a tight distribution of threshold voltage ($V_T$) of memory cells in 3D NAND memory devices may be important factors to prevent events such as re-read triggers in a system. For example, in accordance with the present disclosure, a reset read operation may help ensure blocks of 3D NAND memory array operate in a predetermined transient state to produce a tight cell $V_T$ distribution and a wide RWB.

A reset read operation may, in some embodiments, be related to a command that may be utilized at a system's discretion to efficiently set or maintain one or more blocks of 3D NAND memory cells in a transient state to reduce re-read triggers in the system. The transient state may, in some embodiments, have an improved RWB. RWB generally refers to a separation in voltage between two different groups of cell $V_T$ distributions. In contrast, a stable state may refer to a state of one or more blocks of 3D NAND memory cells to be in when the blocks are left unread for a certain amount of time. The stable state, in some embodiments, may be associated with an increased RBER when compared to the transient state. A reset read operation may run a read recovery portion of a full read operation leading to a faster execution time and a reduced power consumption when run for one or more blocks of memory cells. In addition, a reset read operation may be configured to run not only on a single block, but also on multiple blocks up to a maximum number of blocks that may be determined by various factors including power consumption incurred by ramping up and down control gates of 3D NAND memory array—either concurrently or not. In some embodiments, the maximum number of blocks may be determined via a calculator per a product design identification. In some embodiments, a reset read operation may be configured to be automatically executed for the entire die (or another subset). In some embodiments, a reset read operation may be configured to be automatically executed at the end of an erase operation to bring blocks to the transient state after any erase is performed on the die.

The foregoing discussion provides an overview of the disclosure. Features and techniques introduced above are further described below in the context of a system and a memory device level operation of reset read. Specific embodiments are then described for the system or the memory devices, which may include 3D NAND memory devices in some embodiments. These and other features of the disclosure are further illustrated by and described with reference to apparatus diagrams, system diagrams, and flow-charts that relate to reset read operation.

FIG. 1 illustrates an embodiment memory device 100 that supports memory array reset read operation in accordance with various embodiments of the present disclosure. Memory device 100 may also be referred to as an electronic memory apparatus. Memory device 100 includes an array of memory cells 105 that are programmable to store different states. The array of memory cells 105 may be referred to as memory array, memory core, and the like. Each memory cell 105 may be programmable to store two states, denoted as a logic 0 and a logic 1. In some cases, memory cell 105 may be configured to store more than two logic states. A memory cell 105 may, in some embodiments, include a 3D NAND memory cell.

Memory device 100 may include a three-dimensional (3D) memory array, where two-dimensional (2D) memory arrays are formed on top of one another. This may increase the number of memory cells that may be placed or created on a single die or substrate as compared with 2D arrays, which in turn may reduce production costs, or increase the performance of the memory array, or both. Based on the embodiment depicted in FIG. 1, Memory array in memory device 100 includes multiple levels. The levels may, in some examples, be separated by an electrically insulating material. Each level may be aligned or positioned so that memory cells 105 may be aligned (exactly, overlapping, or approximately) with one another across each level, forming memory cell stack 145. In some cases, memory cell stack 145 may be referred to as a string of memory cells and memory cells 105 in the string may be formed at the same time as explained below such that memory cells 105 are self-aligned with respect to each other.

In some examples, each row of memory cells 105 is connected to an access line 110, and each column of memory cells 105 is connected to a digit line 115. Thus, one memory cell 105 may be located at the intersection of an access line 110 and a digit line 115. This intersection may be referred to as a memory cell's address. In some examples, access lines may also be known as word lines, and digit lines may also be known as bit lines. In some cases, word lines 110 and bit lines 115 may be substantially perpendicular to one another and may create an array of memory cells.

In a 3D memory array, each level in a row may have a word line 110. In some cases, memory cell stack 145 may have an electrode common to the memory cells 105 in memory cell stack 145. For example, a conductive extension may be coupled to a digit line 115 and commonly connected to memory cells 105 in memory cell stack 145. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100.

Operations such as reading and writing may be performed on memory cells 105 by activating or selecting word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti)), metal alloys, carbon, or other conductive materials, alloys, or compounds. In some cases, word lines 110 may include poly-silicon layer. Upon selecting memory cell 105, the resulting signal may be used to determine the stored logic state. For example, a voltage may be applied and the resulting current may be used to differentiate between the resistive states of the phase change material or the amount of electrons stored in floating gates manifested as threshold voltage differences.

Accessing memory cells 105 may be controlled through row decoder 120 and column decoder 130. For example, row decoder 120 may receive a row address from memory controller 140 and activate appropriate word line 110 based on the received row address. Similarly, column decoder 130 may receive a column address from memory controller 140 and activate appropriate bit line 115. Thus, by activating one word line 110 and one bit line 115, one memory cell 105 may be accessed.

Upon accessing, memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the magnitude of the resulting current may depend on the status of the memory cell 105. Likewise, a current may be applied to a memory cell 105 and the magnitude of the voltage to create the current may depend on the status of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may connected to or in electronic communication with column decoder 130 or row decoder 120.

A memory cell 105 may be set or written by similarly activating the relevant word line 110 and bit line 115 and at least one logic value may be stored in the memory cell 105. Column decoder 130 or row decoder 120 may accept data, for example input 135, to be written to the memory cells 105. In the case of 3D NAND memory, a memory cell 105 is written by storing electrons in a floating gate or an insulating layer. In the case of phase change memory, a memory cell 105 is written by heating the memory element, for example, by passing a current through the memory element.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as 3D NAND, FeRAM, or PCM memory, accessing the memory cell 105 may not destroy the logic state and, thus, the memory cell 105 may not require re-writing after accessing.

Memory controller 140 may control the operation (e.g., read, write, re-write, refresh) of memory cells 105 through the various components, for example, row decoder 120, column decoder 130, and sense component 125. In some cases, one or more of row decoder 120, column decoder 130, and sense component 125 may be co-located with memory controller 140. Memory controller 140 may generate row and column address signals in order to activate the desired word line 110 and bit line 115. Memory controller 140 may also generate and control various voltage potentials or currents used during the operation of memory device 100. In general, the amplitude, shape, or duration of an applied voltage or current discussed herein may be adjusted or varied and may be different for the various operations discussed in operating memory device 100. Furthermore, one, multiple, or all memory cells 105 within memory device 100 may be accessed simultaneously; for example, multiple or all cells of memory device 100 may be accessed simultaneously during a reset operation in which all memory cells 105, or a group of memory cells 105, are set to a single logic state.

In some embodiments, memory controller 140 may operate in conjunction with a system level memory controller to execute a reset read operation on one or more blocks of one or more memory cells (e.g., 3D NAND memory cells). In some embodiments, the system level memory controller may issue a single command to execute the reset read command according to some set features and trim conditions, and memory controller 140 may initiate or perform the reset read command for memory device 100 based on the set features and the trim conditions. In some embodiments, memory controller 140 may track when a read operation has been performed for one or more blocks of the memory array in memory device 100. Based on this tracking, memory controller 140 may assist the system level memory controller in issuing a command to perform one or more reset read operations through communication with the system level memory controller.

Figure 2:
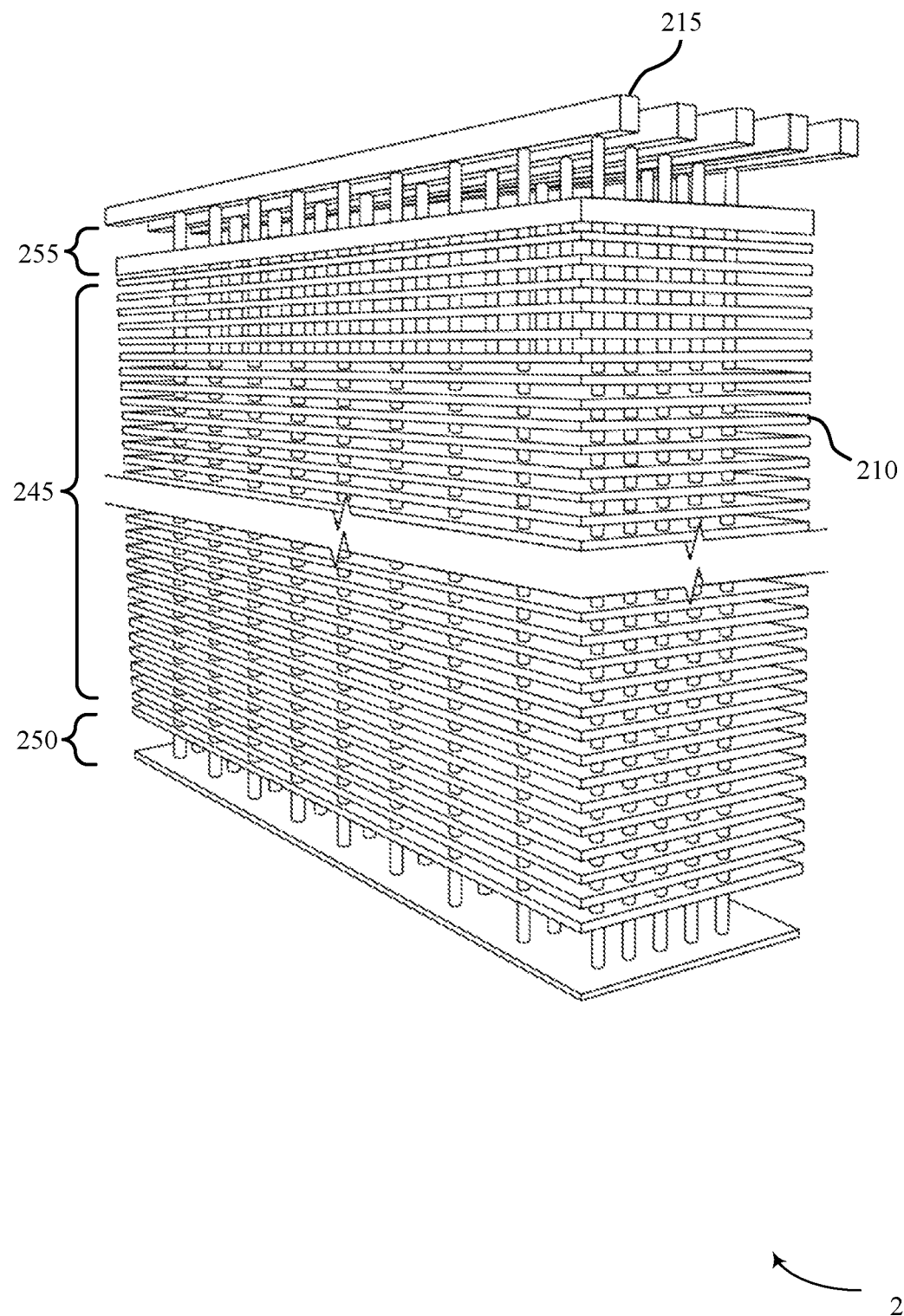
FIG. 2 shows an exemplary diagram of 3D NAND memory array that support memory array reset read operation in accordance with embodiments of the present disclosure.

FIG. 2 shows an exemplary schematic diagram of 3D NAND memory array 200 that support memory array reset read operation in accordance with embodiments of the present disclosure. 3D NAND memory array 200 may be an embodiment of array of memory cells 105 as described with reference to FIG. 1. 3D NAND memory array 200 may include strings of memory cells 245, source region 250, drain region 255, bit lines 215, and word lines 210. Bit lines 215 and word lines 210 may be embodiments of bit lines 115 and word lines 110 as described with reference to FIG. 1. Source region 250 and drain region 255 may include additional components as described below with reference to FIGS. 4 and 5. Strings of memory cells 245 may include extra cells at both ends to account for non-uniformity associated process variations at boundaries. Extra cells may not be used to store information but provide a transitional region for active memory cells to be fabricated with uniform process conditions. Active memory cells may be used to store information represented as logic states. In some embodiments, number of active memory cells within a string may be 128.

In some embodiments, all word lines 210 of a block of memory cells may be electrically coupled with each other during a reset read operation so that a potential difference between word lines 210 and a channel region (not shown) shared by active memory cells within the string of memory cells 245 may be adjusted to accomplish the transient state for the block of memory cells (e.g., 3D NAND memory cells) based at least in part on the reset read operation (e.g., after completing the reset read operation). During the reset read operation, in some embodiments, bit lines 215, source region 250, and drain region 255 may be electrically coupled together and fixed at a first voltage level (e.g., a ground potential).

Figure 3:
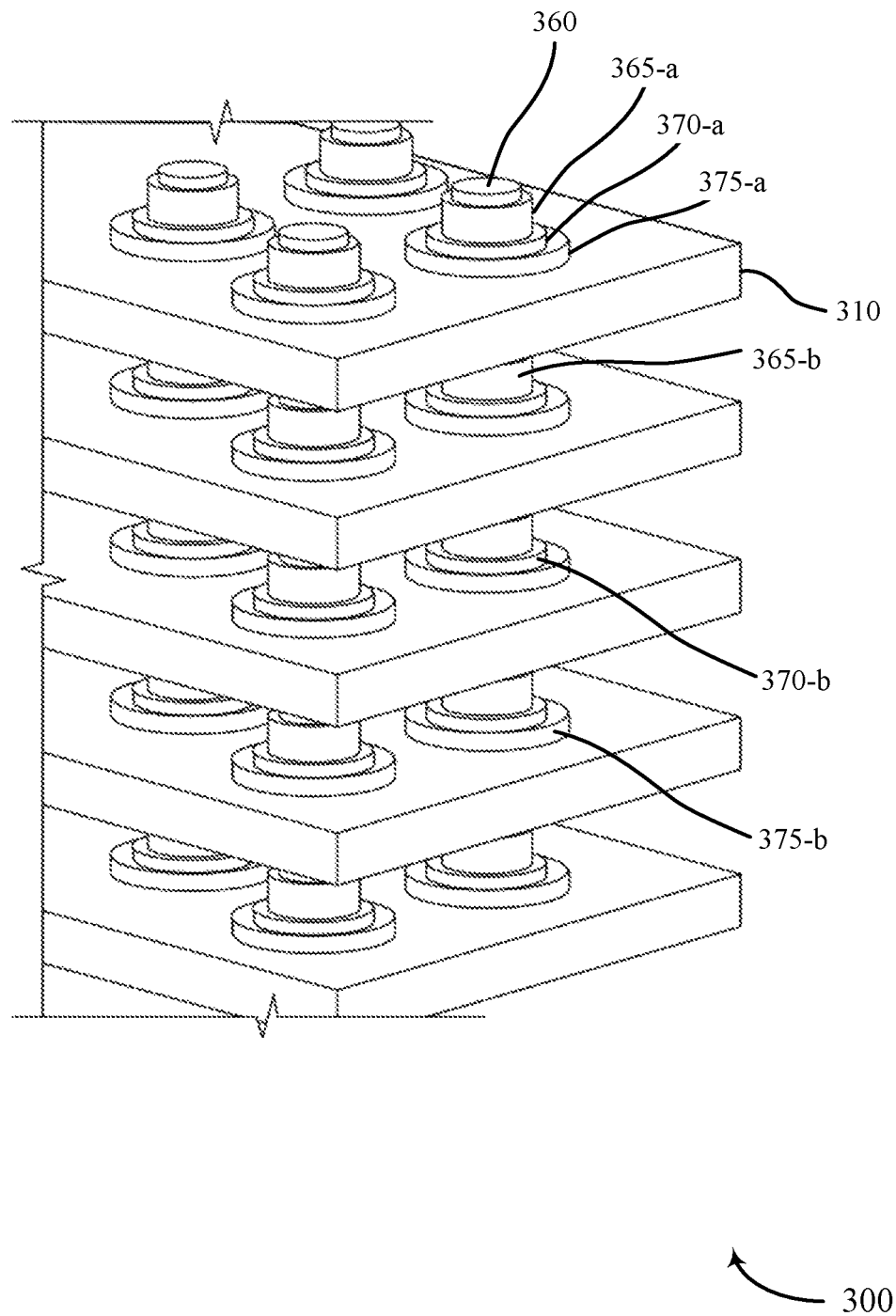
FIG. 3 shows an exemplary diagram of 3D NAND memory cells that support memory array reset read operation in accordance with embodiments of the present disclosure.

FIG. 3 shows an exemplary schematic diagram of 3D NAND memory cells 300 that support memory array reset read operation in accordance with embodiments of the present disclosure. 3D NAND memory cells 300 may be embodiments of memory cell stack 145 and strings of memory cells 245 as described with reference to FIGS. 1 and 2 where each columnar structure depicted in FIG. 3 may be an embodiment of a string of memory cells 245. 3D NAND memory cells may include dielectric plug 360, channel 365, tunnel oxide 370, inter poly-silicon dielectric (IPD) 375, and word line 310. Word lines 310 may be an embodiment of word lines 110 and 210 as described with reference to FIGS. 1 and 2. In addition, 3D NAND memory cells may also include poly-silicon floating gate (not shown). Spaces between word lines 310 may, in some embodiments, include a dielectric layer to provide electrical insulation. Channel 365 and tunnel oxide 370 are shown as a discontinuous layer for illustrative purposes, but may, in some alternative embodiments, be a continuous layer throughout strings of memory cells. Although some elements included in FIG. 3 are labeled with a numeric indicator, other corresponding elements are not labeled, though they are the same or would be understood to be similar, in an effort to increase visibility and clarity of the depicted features.

Overall fabrication sequence for producing 3D NAND memory cells 300 may be arranged as described below. Alternating layers of poly-silicon (e.g., word lines 310) and dielectric material (e.g., dielectric layers in between word lines 310) may be deposited on a substrate. The substrate may already have complementary metal oxide silicon (CMOS) circuitry or other components of memory device built on it. An array of holes, 3D cell holes, may be formed within the alternating layers of poly-silicon and dielectric material. 3D cell holes provide spaces in which strings of memory cells may be formed subsequently. After forming the 3D cell holes, selective recessing of poly-silicon layers with respect to dielectric material may follow to create cavities. An inter poly-silicon dielectric (IPD) layer (e.g., IPD 375) may be deposited inside of the 3D cell holes without completely filling the cavities. In some embodiments, IPD layer may include oxide, nitride, and oxide layers. Subsequently, a poly-silicon layer (e.g., floating gate) may be deposited to fill the cavities without completely filling the 3D cell holes. Excess poly-silicon deposited outside of the cavities may be removed to leave the poly-silicon inside the cavities only. Then, tunnel oxide (e.g., tunnel oxide 370) may be deposited followed by a poly-silicon layer (e.g., channel 365) deposition. Remaining space in the 3D cell holes may be filled with a dielectric material (e.g., dielectric plug 360).

The process sequence described above may be carried out to form at least some, if not all, memory cells present in a string of memory cells at the same time. In some embodiments, 128 active memory cells within a string may be formed concurrently at the end of the process steps. Thus, the process may provide a competitive fabrication cost and eliminate any issues associated with significant misalignments among memory layers. There may be additional process steps before and after the process sequence described above to complete entire process to fabricate 3D NAND memory devices.

In some embodiments, during the reset read operation, a voltage applied to word lines 310 may be increased to a level higher than the highest threshold voltage of one or more memory cells sharing channel 365 within a string. This may result in channel 365 being electrically conductive throughout the string. As discussed below, channel 365 may be subsequently electrically disconnected from source and drain regions of the string (not shown) during the reset read operation. Hence, channel 365 of the string may be electrically isolated from the source and drain regions of the string and yet capacitively coupled to word lines so that electric field between the channel 365 and word lines 310 may be established and maintained to bring 3D NAND memory cells in the transient state at the completion of the reset read operation.

Figure 4:
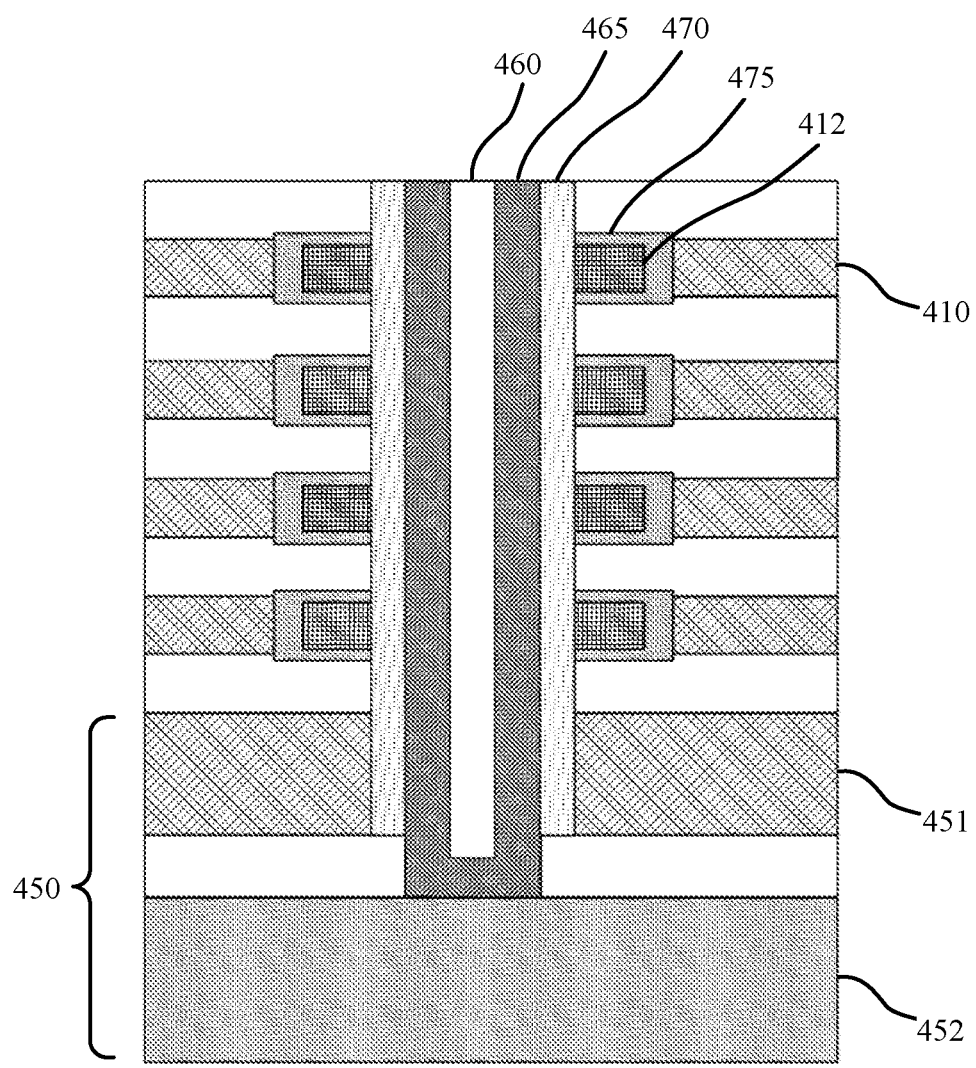
FIG. 4 shows an exemplary cross-section diagram of 3D NAND memory cells that support memory array reset read operation in accordance with embodiments of the present disclosure.

FIG. 4 shows an exemplary schematic cross-section diagram of 3D NAND memory cells 400 that support memory array reset read operation in accordance with embodiments of the present disclosure. FIG. 4 depicts one embodiment of a cross-sectional view of a columnar structure associated with a 3D cell hole having memory cells formed therein as described with reference to FIG. 3. 3D NAND memory cells may include dielectric plug 460, channel 465, tunnel oxide 470, inter poly-silicon dielectric (IPD) 475, floating gate (FG) 412, and word line 410. Dielectric plug 460, channel 465, tunnel oxide 470, and inter poly-silicon dielectric (IPD) 475 may be embodiments of dielectric plug 360, channel 365, tunnel oxide 370, and inter poly-silicon dielectric (IPD) 375 as described with reference to FIG. 3, respectively. Word lines 410 may be embodiments of word lines 110, 210, and 310 as described with reference to FIGS. 1 through 3. In addition, spaces between word lines 410 may include a dielectric layer to provide electrical insulation in some embodiments. As mentioned above, channel 465 and tunnel oxide 470 may, in some embodiments, be continuous throughout memory cells within a cell string. It should be appreciated that FG 412 may be electrically isolated from at least one or more neighboring FGs and at least one or more word lines as IPD 475 and tunnel oxide 470 may, in some embodiments, encapsulate FG 412 completely. IPD 475 provides capacitive coupling between word line 410, also known as control gate (CG), and floating gate (FG). During 3D NAND memory operations, various amount of electrons may be stored in FG 412 to modulate threshold voltage ($V_T$) of 3D NAND memory cells.

During 3D NAND memory operations, electrons may be injected to FG 412 or removed from FG 412 by controlling voltage levels associated with channel 465 and CG 410. In some embodiments, electrons may be attracted from channel 465 to FG 412 across tunnel oxide 470 when sufficiently high positive voltage is present at CG 410 with respect to channel 465. On the other hand, electrons may be removed from FG 412 to channel 465 across tunnel oxide 470 when sufficiently high positive voltage is present at channel 465 with respect to CG 410. Amount of electrons stored in FG 412 at a given time may determine threshold voltages of 3D NAND memory cells. In other words, when a relatively larger amount of electrons are present in FG 412, corresponding 3D NAND memory cell may exhibit a relatively higher threshold voltage when compared to another 3D NAND memory cell having a fewer amount of electrons in its FG. Different threshold voltage(s) of 3D NAND memory cells may result in different signals when voltages are applied to read information stored in 3D NAND memory cells.

Also shown in FIG. 4 is source region 450. Source region 450 may be an embodiment of source region 250 as described with reference to FIG. 2. Source region 450 may include gate 451 of select gate device for source (SGS) and source 452 for strings of memory cells 400. In some cases, source 452 may be referred to as source plane. It should be appreciated that channel 465 may be physically connected to source 452 as illustrated in FIG. 4. Depending on a voltage level applied to gate 451 of a SGS, the channel associated with gate 451 may be either highly conductive (e.g., ON, having a conductivity level greater than a threshold) or highly resistive (e.g., OFF, having a conductivity level less than a threshold). Namely, when the voltage level applied to gate 451 is higher than a threshold voltage of a SGS, the channel associated with a SGS may be highly conductive and thus electrically connect channel 465 to source 452. When the voltage level applied to gate 451 is lower than the threshold voltage of a SGS, the channel associated with a SGS may be highly resistive and thus electrically disconnect channel 465 from source 452. Thus, channel 465 may be electrically connected or disconnected to source 452 by controlling the voltage level applied to gate 451 of a SGS.

In some embodiments, during a reset read operation, a first voltage applied to gate 451 of a SGS may be increased above the threshold voltage of a SGS resulting in channel 465 electrically connected to source 452. As discussed above, a second voltage applied to word line 410 may be increased above the highest threshold voltage of memory cell in a string of memory cells. Subsequently, the first voltage applied to gate 451 of a SGS may be reduced below the threshold voltage of a SGS resulting in channel 465 being electrically disconnected from source 452. In some embodiments, gate 451 of a SGS may assist to electrically isolate channel 465 during the reset read operation.

Figure 5:
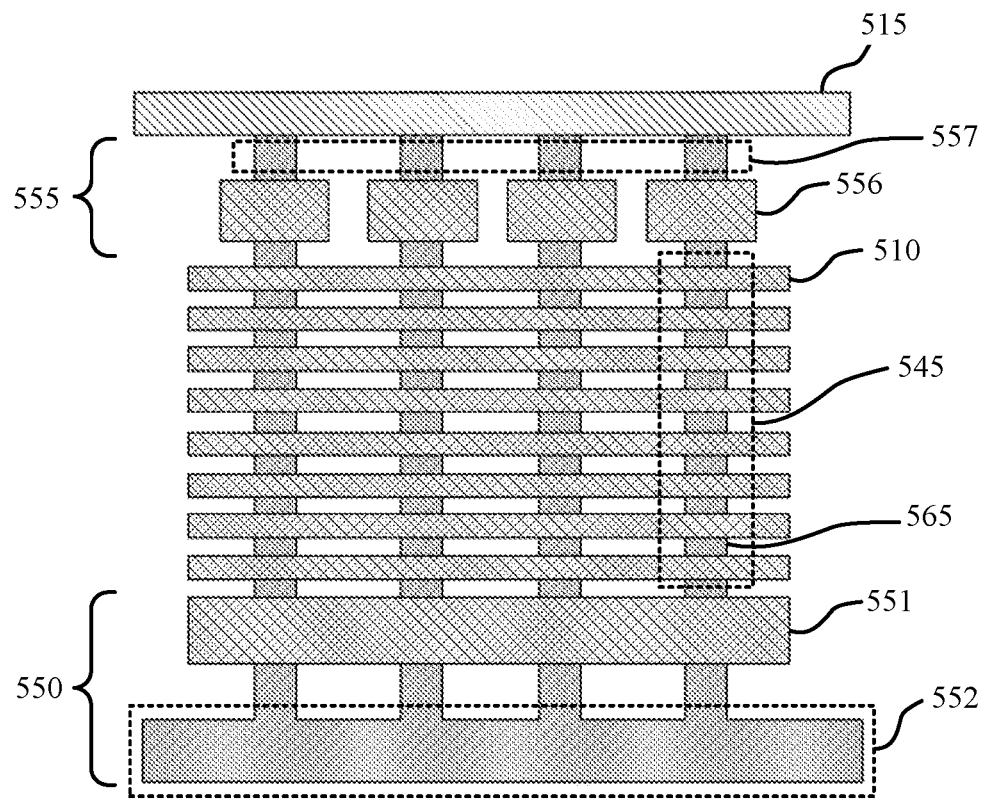
FIG. 5 shows an exemplary diagram of 3D NAND memory array that support memory array reset read operation in accordance with embodiments of the present disclosure.

FIG. 5 shows an exemplary schematic diagram of 3D NAND memory array 500 that support memory array reset read operation in accordance with embodiments of the present disclosure. 3D NAND memory array 500 may be an embodiment of 3D NAND memory array 200 as described with reference to FIG. 2. 3D NAND memory array 500 may include strings of 3D NAND memory cells 545, source region 550, drain region 555, and bit line 515. Details of each memory cell are omitted for simplicity except channel 565 and word line 510 for illustration purpose. Channel 565 may be an embodiment of channel 465 as described with reference to FIG. 4. Source region 550 may be an embodiment of source regions 250 and 450 as described with reference to FIGS. 2 and 4. Although some elements included in FIG. 5 are labeled with a numeric indicator, other corresponding elements are not labeled, though they are the same or would be understood to be similar, in an effort to increase visibility and clarity of the depicted features.

Drain region 555 may be an embodiment of drain region 255 as described with respected to FIG. 2. Source region 550 may further include gate 551 of a SGS associated with source 552. Source region 550, gate 551 of a SGS, and source 552 may be embodiments of source region 450, gate 451 of a SGS, and source 452 as described with FIG. 4, respectively. Drain region 555 may further include gate 556 of a select gate device for drain (SGD) associated with drain 557. Gate 556 of a SGD associated with drain 557 may electrically connect or disconnect to a channel of a cell string of memory cells 545 to drain 557 depending on a voltage level applied to gate 556. Drain 557 may be electrically connected to bit line 515. Bit line 515 may be an embodiment of bit lines 115 and 215 as described with reference to FIGS. 1 and 2. Word line 510 may be an embodiment of word line 110, 210, 310, and 410 as described with reference to FIGS. 1 through 4. Cross-points between word line 510 and channel 565 may be viewed as locations where each 3D NAND memory cell is located.

In some embodiments, during a reset read operation, a first voltage applied to gate 556 of a SGD may be increased above the threshold voltage of a SGD resulting in channel 565 being electrically connected to drain 557. As discussed above, a second voltage applied to word line 510 may be increased above the highest threshold voltage of memory cell in string 545. Subsequently, the voltage applied to gate 551 of a SGD may be reduced below the threshold voltage of a SGD resulting in channel 565 being electrically disconnected from drain 557. Gate 556 of a SGD may assist to electrically isolate channel 565 during the reset read operation.

Figure 6:
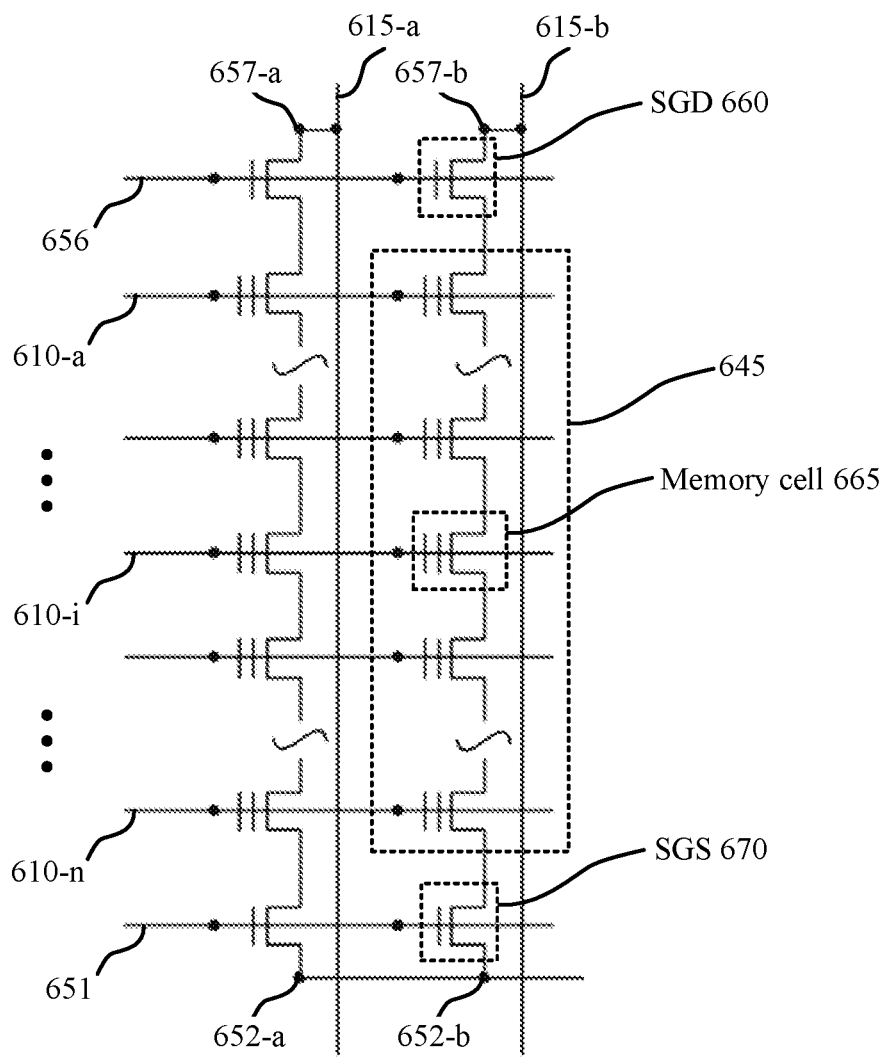
FIG. 6 illustrates an example of circuit that supports memory array reset read operation in accordance with embodiments of the present disclosure.

FIG. 6 illustrates an embodiment of circuit 600 that supports memory array reset read operation in accordance with embodiments of the present disclosure. Circuit 600 may include string of 3D NAND memory cells 645, bit line 615, gate 656 of a SGD 660 associated with drain 657, word lines 610, and gate 651 of a SGS 670 associated with source 652. String of 3D NAND memory cells 645 may be an embodiment of string of memory cells 545 as described with reference to FIG. 5. String of 3D NAND memory cells 645 may include 3D NAND memory cells 665. Bit line 615 may be an embodiment of bit lines 115, 215, and 515 as described with reference to FIGS. 1, 2, and 5. Drain 657 may be an embodiment of drain 575 as described in FIG. 5. Gate 656 of a SGD associated with drain 657 may be an embodiment of gate 556 as described in FIG. 5. Word lines 610 may be embodiments of word lines 110, 210, 310, 410, and 510 as described with reference to FIGS. 1 through 5. A number of word lines may correspond to number of memory cells in string 645. In some examples, the number may be 128 (excluding word lines associated with extra memory cells). Source 652 may be an embodiment of source 452 and 552 as described in FIGS. 4 and 5. Gate 651 of a SGS associated with source 652 may be an embodiment of gate 451 and 551 as described in FIGS. 4 and 5. Although some elements included in FIG. 6 are labeled with a numeric indicator, other corresponding elements are not labeled, though they are the same or would understood similar, in an effort to increase visibility and clarity of the depicted features.

During 3D NAND memory operations, various voltage levels associated with source 652, gate 651 of a SGS associated with source 652, word lines 610, drain 657, gate 656 of a SGD associated with drain 657, and bit line 615 may be applied to perform one or more operations (e.g., program, erase, or read) on at least some 3D NAND memory cells in memory string 645. In some cases, during a first operation (e.g., a read operation), a positive voltage may be applied to bit line 615 connected to drain 657 whereas source 652 may be connected to a ground or a virtual ground (e.g., approximately 0 V). In some cases, the voltage applied to drain 657 may be 1 V. In addition, voltages applied to gate 651 and 656 may be increased above one or more threshold voltages of one or more SGSs associated with source 652 and one or more SGDs associated with drain 657 such that channel associated with memory string 645 may be electrically connected to drain 657 and source 652.

At the same time, a plurality of word lines 610 (e.g., in some cases all word lines 610) except a selected word line (i.e., word lines associated with unselected cells in string 645) may be connected to a voltage (e.g., VREAD) that is higher than the highest threshold voltage ($V_T$) of memory cells in string 645. VREAD may cause all of the unselected memory cells in string 645 turn "ON" so that each unselected memory cell can maintain high conductivity in a channel associated with it. In some embodiments, a word line associated with a selected cell may be connected to a voltage, $V_{Target}$. $V_{Target}$ may be selected at a value between $V_T$ of an erased memory cell and $V_T$ of a programmed memory cell in memory string 645. When the selected memory cell exhibits an erased $V_T$ (e.g., $V_{Target} > V_T$ of the selected memory cell), the selected memory cell may turn "ON" in response to the application of $V_{Target}$ and thus allow a current to flow in the channel of memory string 645 from bit line 615 to source 652. When the selected memory cell exhibits a programmed $V_T$ (e.g., hence $V_{Target} < V_T$ of the selected memory cell), the selected memory cell may turn "OFF" in response to $V_{Target}$ and thus prohibit a current to flow in the channel of memory string 645 from bit line 615 to source 652. In some embodiments, the current flow or lack thereof, may be sensed by sense component 125 as described with reference to FIG. 1 to read stored information in the selected 3D NAND memory cell within string 645.

In some embodiments, during a reset read operation, all word lines 610 may be coupled together. A voltage applied to all word lines coupled together may be increased above the highest threshold voltage of memory cell in string 645. In some embodiments, one or more of gate 656 of a SGD and/or gate 651 of a SGS may be increased above threshold voltages of a SGD and a SGS to electrically connect channel of string 645 to source 652 and drain 657 that may be fixed at a first voltage (e.g., a ground potential). Subsequently, one or more of gate 656 of a SGD and gate 651 of a SGS may be decreased below threshold voltages of a SGD and a SGS so that a channel of string 645 may be isolated from source 652 and drain 657.

Figure 7:
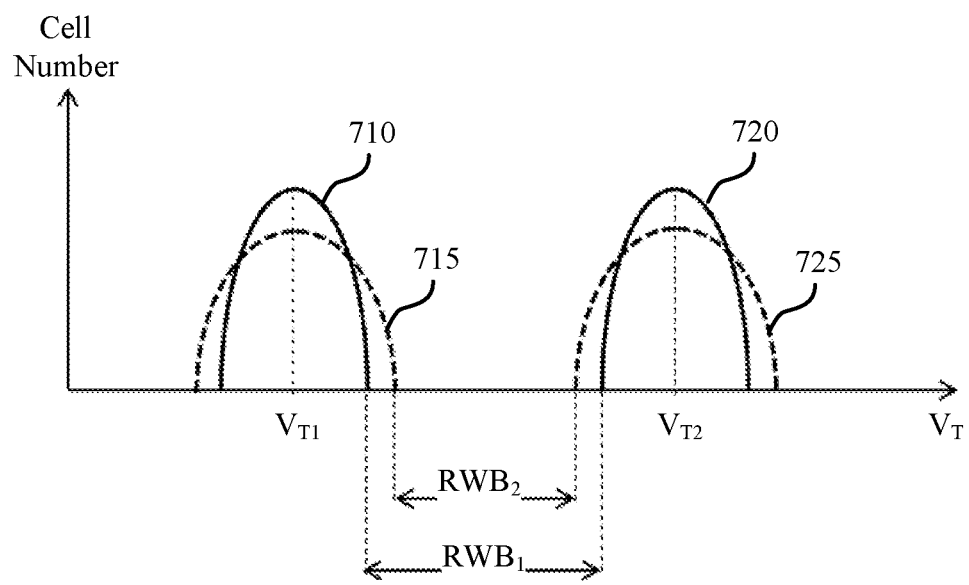
FIG. 7 illustrates examples of memory cell threshold voltage distributions that support memory array reset read operation in accordance with embodiments of the present disclosure.

FIG. 7 illustrates embodiments of memory cell threshold voltage ($V_T$) distributions 700 that support memory array reset read operation in accordance with embodiments of the present disclosure. $V_T$ distributions 700 depict a number of memory cells with a certain $V_T$ (y-axis) as a function of $V_T$ of one or more memory cells (x-axis). Distribution 710 may exhibit a median $V_T$ of $V_{T1}$ while distribution 720 may exhibit a median $V_T$ of $V_{T2}$. Voltage difference between the highest $V_T$ of distribution 710 and the lowest $V_T$ of distribution 720 may be correlate with or related to a read window budget ($RWB_1$). In some embodiments, the $V_{Target}$ applied should fall within $RWB_1$ to determine whether a memory cell exhibits a $V_T$ of distribution 710 or distribution 720 as described above with reference to FIG. 6.

In some cases, repeated program and erase cycles, passage of time, or combination thereof may cause $V_T$ distributions to shift and/or become wider. Distribution 715 may represent a widened distribution of distribution 710 and distribution 725 may represent a widened distribution of distribution 720 that may occur based on one or more circumstances. Distributions 715 and 725 may or may not, in some embodiments, exhibit the same median $V_T$ of distributions 710 and 720. Resulting $RWB_2$ associated with distributions 715 and distribution 725 may be significantly narrower than $RWB_1$ and necessitate a tighter control of $V_{Target}$ determination and placement within $RWB_2$ to accurately determine whether a memory cell exhibits a $V_T$ of distribution 715 or distribution 725. When RWB between two $V_T$ distributions becomes intolerably narrow, a proper $V_{Target}$ positioning may become difficult and accurate determination of information of memory cells may not be ascertainable resulting in increased level of bit error rate (BER).

In some embodiments, when a system encounters errors associated with sub-optimum BER, the system may trigger re-read to achieve an error correction code (ECC) correctible solution and experience a significant penalty in system performance. In some cases, the trigger rate and BER recovery time are a function of RWB, operating temperature, and number of logical bits per memory cell. Therefore, maintaining a tight $V_T$ distribution, a wide RWB, and a lower level of BER of memory devices may be desirable for reliable operation of system that employs such memory devices.

In some embodiments, distributions 710 and 720 may correspond to the transient state of memory cells exhibiting a wide RWB and a lower level of BER while distribution 715 and 725 may correspond to the stable state of memory cells exhibiting a narrower RWB and a higher level of BER.

Figure 8:
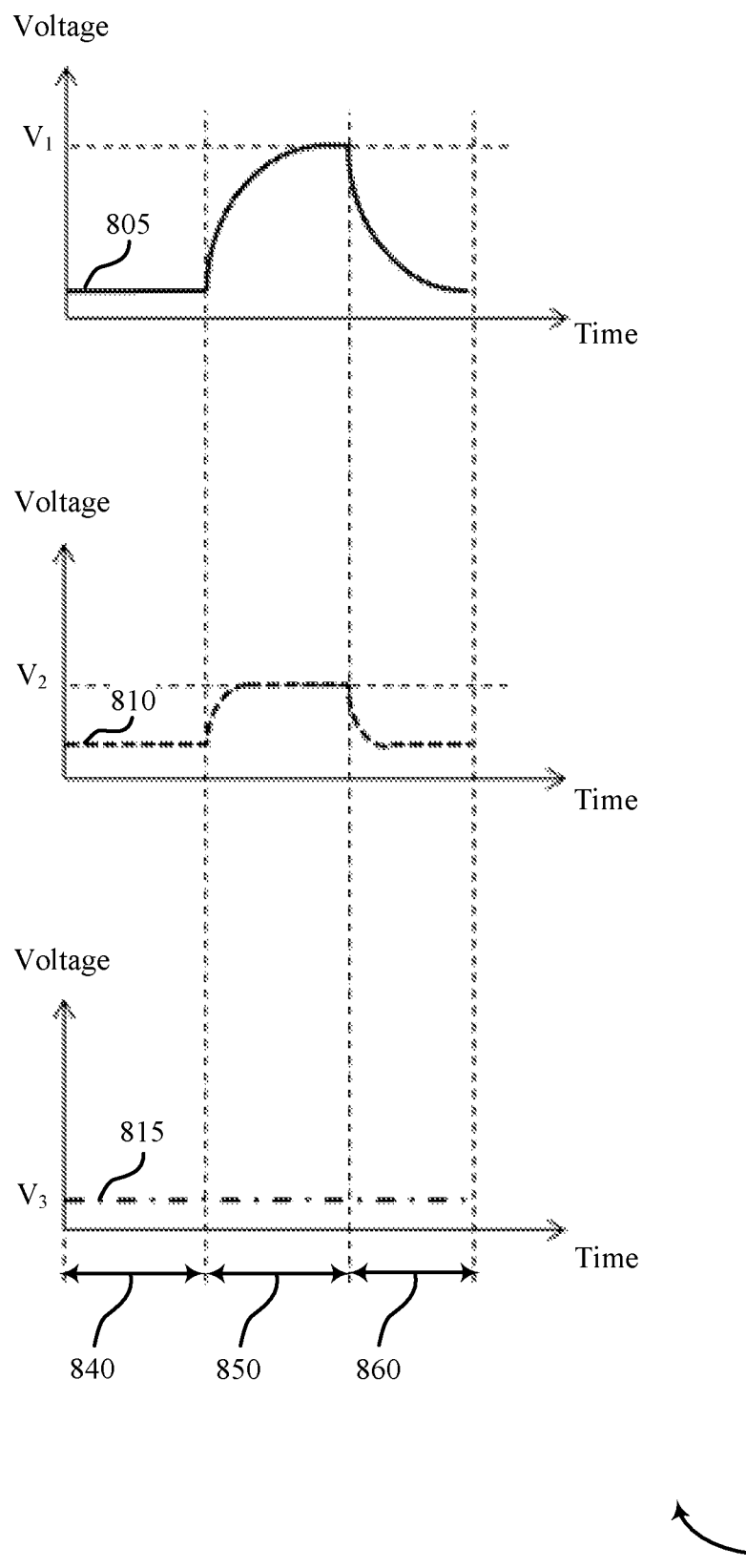
FIG. 8 illustrates an example related to memory array reset read operation in accordance with embodiments of the present disclosure.

FIG. 8 illustrates embodiments of a voltage plot 800 depicting voltages as a function of time that support memory array reset read operation in accordance with embodiments of the present disclosure. Voltages 800 depict various changes of voltages applied to one or more components or elements (e.g., word lines, gates of a SGS and a SGD, source, drain, bit lines). Word lines may refer to word lines 110, 210, 310, 410, 510, and 610 as described with reference to FIGS. 1 through 6. Gates of a SGS may refer to gates 451, 551, and 651 of a SGS as described with reference to FIGS. 4 through 6. Gates of a SGD may refer to gates 556 and 656 as described with reference to FIGS. 5 and 6. Voltages 800 may describe voltage conditions during reset read operation. Voltage plot 800 may represent voltage conditions during a reset read operation (e.g., a part of a full read operation). For example, voltage 805 may be applied to all word lines (e.g., word line 610) associated with the block of 3D NAND memory array. In some cases, voltage 805 may be applied to at least a subset of word lines associated with the block. In addition, voltage 810 may be applied to all or at least a subset of gates of at least one SGS (e.g., gate 651) associated with source and gates of a SGD (e.g., gate 656), and voltage 815 may be applied to source (e.g., source 652), drain (e.g., drain 657), and/or bit line (e.g., bit line 615) of memory string and may remain constant during reset read operation. A reset read operation may, in some embodiments, initiate actions that provide conditions to ensure 3D NAND memory cells to be in a condition in which 3D NAND memory cells exhibit a tight distribution having a wide RWB and a lower level of BER. The condition may be referred to as a transient state and 3D NAND memory cells in the transient state may be represented as distribution 710 or 720 in comparison to distribution 715 or 725 as described with reference to FIG. 7. In addition, reset read operation may set 3D NAND memory cells in the transient state when 3D NAND memory cells were not in the transient state.

As discussed above, the status of 3D NAND memory cells at the completion of reset read operation may be referred to as a transient state. The transient state may be a temporary state of a programmed 3D NAND memory cells. The best standard deviation in memory cell $V_T$ distribution (e.g., a tight $V_T$ distribution) and BER may be achieved when 3D NAND cells are in the transient state because RWB may be tuned for the transient state and random telegraph noise (RTN) may be reduced in the transient state. By contrast, status of programmed 3D NAND memory cells when left idle for sufficient period of time may be referred to as a stable state. When 3D NAND memory cells are in the stable state, there is a RWB downside due to potential widening of the memory cell $V_T$ distribution and $V_T$ shift. Hence, the transient state, that may be set by a reset read operation in some embodiments, may be associated with a tighter $V_T$ distribution, a wider RWB, and a lower level of BER when compared to those of the stable state.

A reset read operation may include preparation part 840, ramp part 850, and recovery part 860. During preparation part 840, preparatory steps may be taken such as turning on and raising on-chip voltage pumps to one or more voltage levels and decoding of one or more portions of 3D NAND memory array on which reset read operation may be performed. In some embodiments, a portion may correspond to at least one block of 3D NAND memory array. A block of 3D NAND memory array may include strings of 3D NAND memory cells. Strings of 3D NAND memory cells may refer to strings 245, 345, 445, 545, and 645 as described with reference to FIGS. 2 through 6. The following discussion describes changes in voltage conditions during reset read operation and relates to semiconductor device level operations associated with strings of 3D NAND memory cells in response to the voltage changes. The discussion may be understood with reference to a circuit diagram, as described in some embodiments with reference to FIG. 6.

During ramp part 850 of reset read operation, voltage 805 may be increased to a voltage level $V_1$. $V_1$ may, in some embodiments, be referred to as $V_{PassR}$ and may be higher than the highest $V_T$ of at least some of the memory cells in the block. Hence, when voltage 805 reaches $V_1$ entire memory cells of the block may turn "ON" in response to voltage 805. At the same time, or at least during a partially overlapping period, voltage 810 may, in some embodiments, reach $V_2$ in a shorter amount of time than voltage 810 reaches $V_1$. $V_2$ may, in some embodiments, be different (e.g., higher) than $V_T$ of both a SGS and a SGD. Thus, source and drain of memory cell string (e.g., source 652 and drain 657) are electrically connected to channel of memory cell string (e.g., string 645) when voltage 810 applied to gates of a SGS and a SGD reaches $V_2$. Voltage 815 may be applied to source (e.g., source 652), drain (e.g., drain 657), and/or bit line (e.g., 615) of memory string and remain constant during reset read operation, where source, drain, and bit line, or a combination thereof may be regarded a common node connected electrically. Voltage 815 may, in some embodiments, remain constant during reset read operation at a voltage level $V_3$. In some cases, voltage 815 may be at a first voltage (e.g., ground, virtual ground, approximately 0 V). In some cases, voltage 815 may correspond to a certain fixed voltage level that may be beneficial to achieve the transient state for the memory cells.

During recovery part 860 of a reset read operation, voltage 805 may decrease below $V_{PassR}$. When voltage 805 is reduced below $V_T$ of a 3D NAND memory cell, a part of channel associated with the memory cell may no longer be highly conductive. This phenomenon may be referred to as "pinch-off." When pinch-off occurs at one or more cells in a string of 3D NAND memory cells as voltage 805 decreases, the channel in the string may no longer be continuously conductive throughout. In addition, voltage 810 may be reduced below $V_T$ of both a SGS and a SGD approximately at the same time when voltage 805 starts to decrease. As soon as voltage 810 is decrease below $V_T$ of a SGS and a SGD, the channel of the memory string may be electrically disconnected from the source, the drain, and at least some of the bit lines of the block. Therefore, the channel of the memory string may become electrically isolated from the source, the drain, and at least some of the bit lines of the block, but may be capacitively coupled to word line (e.g., control gate, (CG)) while voltage 805 applied to word line continues to decrease. As a result, recovery part 860 may drive the channel potential negative for a programmed block establishing the electrical field between channel and word line (i.e., CG) that brings memory cells in the transient state. When memory cells are left idle for a sufficiently long, however, the electric field between channel and word line (i.e., CG) dissipates and memory cells may enter into the stable state. The electric field may mitigate trapping in the poly-silicon channel and may be attributable to the benefits associated with the transient state of 3D NAND memory cells described above.

The reset read operation described above, in some embodiments, may bring one or more blocks to the transient state while at the same time increasing efficiency. A maximum number of blocks on which the reset read operation may be performed may be determined via an estimator (e.g., a calculator) that may account for a product design identification, power consumption, execution time, time, and/or other factors to initiate or perform a ramping up and down of word lines and/or gates of a SGS and a SGD associated with the reset read operation.

Figure 9:
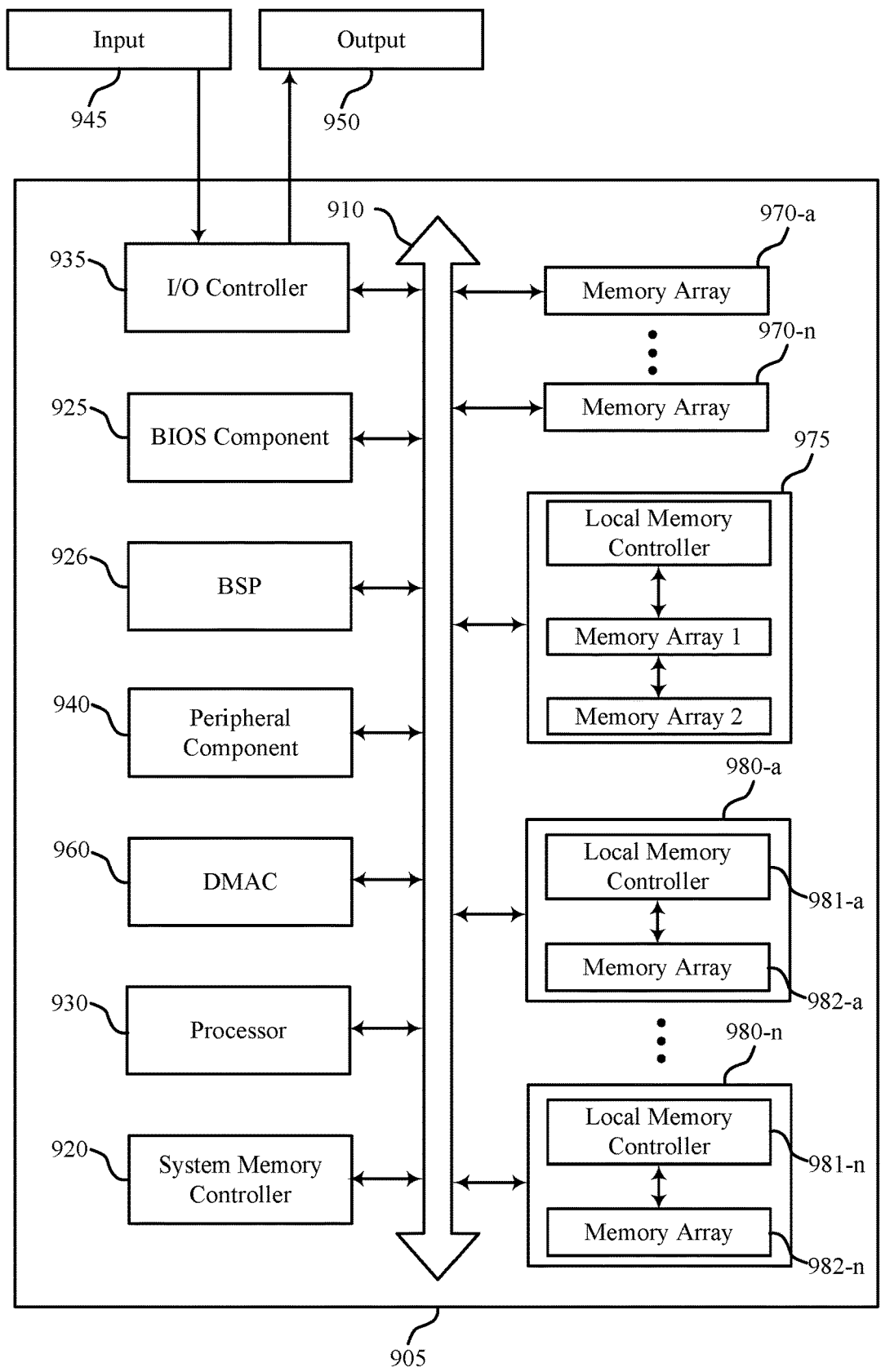
FIG. 9 shows a diagram of a system that supports memory array reset read operation in accordance with embodiments of the present disclosure.

FIG. 9 shows a diagram of a system 900 that supports memory array reset read operation in accordance with embodiments of the present disclosure. System 900 may include a device 905. The device 905 may include a processor 930, a system memory controller 920, and various memory devices 970, 975, and 980. Device 905 may also include input/output controller 935, basic input/output system (BIOS) component 925, board support package (BSP) 926, peripheral component(s) 940, direct memory access controller (DMAC) 960. The components of device 905 may be in electronic communication with one another through bus 910.

Device 905 may be a computing device, electronic device, mobile computing device, or wireless device. Device 905 may be a portable electronic device. Device 905 may be a computer, a laptop computer, a tablet computer, a smartphone, a cellular phone, a wearable device, an internet-connected device, or the like. In some embodiments, device 905 is configured for bi-directional wireless communication via one or more devices (e.g., a base station, an access point). In some embodiments, device 905 is capable of machine-type communication (MTC), machine-to-machine (M2M) communication, or device-to-device (D2D) communication. Device 905 may be referred to as a user equipment (UE), station (STA), mobile terminal, or the like.

Processor 930 may be configured to operate with various memory devices 970, 975, 980, or any combination thereof, either directly or via system memory controller 920. In some cases, Processor 930 may perform functions of system memory controller 920. Processor 930 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components.

System memory controller 920 may be configured to operate with processor 930. System memory controller 920 may also be configured to operate with various memory devices 970, 975, 980, or any combination thereof.

Memory devices 970 may each include an array or arrays of memory cells to store digital information. Memory devices 970 may be configured to operate with processor 930 or system memory controller 920. In some embodiments, memory devices 970 may be configured to serve as a buffer memory for a memory bank for processor 930 or system memory controller 920. In some embodiments, one or more memory devices 970 may be present in device 905.

Memory device 975 may include a local memory controller configured to operate with an array of memory cells structured in two or more tiers. The local memory controller of memory device 975 may also be configured to operate with processor 930. The local memory controller of memory device 975 may be configured to handle different characteristics of memory cells to efficiently operate with processor 930. In some embodiments, first-tier memory cells may be three-dimensional cross-point (3D Xpoint) memory that may provide a high number of input/output operations per second (IOPS) with a short response time to handle various workloads. In some embodiments, second-tier memory cells may be 3D NAND memory that may provide high capacity for data storage at a relatively lower cost than the first-tier memory cells. Memory device 975 may include other types or combinations of memory arrays in some cases.

Memory devices 980 may include a local memory controller configured to operate with an array or arrays of memory cells. The local memory controller of memory device 980 may also be configured to operate with processor 930 or system memory controller 920. In some embodiments, memory cells may include non-volatile or volatile memory cells, or a combination of both non-volatile and volatile memory cells. In some embodiments, the local memory controller of memory device 980 may be configured to handle a variable page size for a memory array where the memory array includes non-volatile memory cells, e.g., ferroelectric memory cells. In some embodiments, a page size may be fixed at a certain size for a memory array where the memory array includes volatile memory cells, e.g., DRAM cells. In some embodiments, one or more memory devices 980 may be present in device 905.

DMAC 960 may enable processor 930 to perform direct memory accesses with memory devices 970, 975, or 980. For example, DMAC 960 may support processor 930 to directly access a memory device 970, 975, or 980 without the involvement or operation of system memory controller 920.

Peripheral component(s) 940 may be any input or output device, or an interface for such devices, that may be integrated into device 905. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. Peripheral component(s) 940 may be other components understood by those skilled in the art as peripherals.

BIOS component 925 or board support package (BSP) 926 may be a software component that includes a basic input/output system (BIOS) operated as firmware, which may initialize and run various hardware components of system 900. BIOS component 925 or BSP 926 may also manage data flow between processor 930 and the various components, e.g., peripheral components 940, input/output controller 935, etc. BIOS component 925 or BSP 926 may include a program or software stored in read-only memory (ROM), flash memory, or any other non-volatile memory.

Input/output controller 935 may manage data communication between processor 930 and peripheral component(s) 940, input devices 945, or output devices 950. Input/output controller 935 may also manage peripherals that are not integrated into device 905. In some cases, input/output controller 935 may represent a physical connection or port to the external peripheral.

Input device 945 may represent a device or signal external to device 905 that provides input to device 905 or its components. This may include a user interface or interface with or between other devices. In some cases, input device 945 may be a peripheral that interfaces with device 905 via peripheral component(s) 940 or may be managed by input/output controller 935.

Output device 950 may represent a device or signal external to device 905 configured to receive output from device 905 or any of its components. Examples of output device 950 may include a display, audio speakers, a printing device, or another processor on printed circuit board, etc. In some cases, output device 950 may be a peripheral that interfaces with device 905 via peripheral component(s) 940 or may be managed by input/output controller 935.

The components of device 905 may be made up of circuitry designed to carry out their functions. This may include various circuit elements, for example, conductive lines, transistors, capacitors, inductors, resistors, amplifiers, or other active or passive elements, configured to carry out the functions described herein.

In some embodiments, memory device 980 may be 3D NAND memory device. In some embodiments, system memory controller 920 may operate in conjunction with local memory controller 981 of memory device 980 to execute a reset read operation on one or more blocks of 3D NAND memory cells of memory array 982. In some embodiments, system memory controller 920 may receive a command (e.g., from an outside source) via processor 930 to keep one or more blocks of 3D NAND memory cells in the transient state or to initiate transition of one or more blocks of 3D NAND memory cell to the transient state if they are in the stable state.

Figure 10:
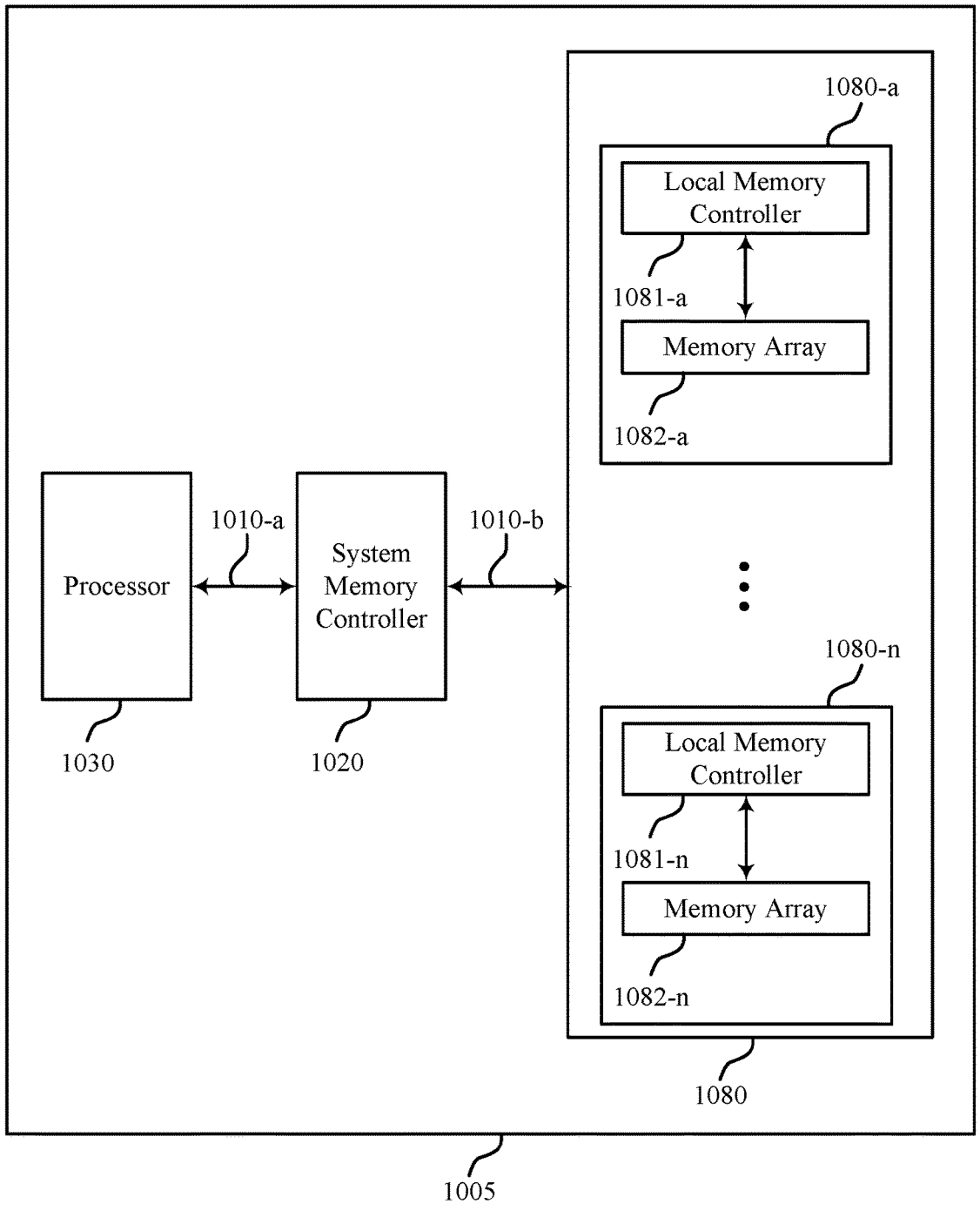
FIG. 10 shows a diagram of a system that supports memory array reset read operation in accordance with embodiments of the present disclosure.

FIG. 10 shows a diagram of a system 1000 that supports memory array reset read operation in accordance with embodiments of the present disclosure. System 1000 may be an embodiment of system 900 as described with reference to FIG. 9 and may include a device 1005. Device 1005 may be an embodiment of device 905 as described with reference to FIG. 9. Device 1005 may include processor 1030, system memory controller 1020, and memory devices 1080. Processor 1030 may be configured to operate with system memory controller 1020 via bus 1010-*a*. System memory controller 1020 may be configured to operate with processor 1030 and memory devices 1080 via buses 1010. Processor 1030 may be an embodiment of processor 930 as described with reference to FIG. 9. System memory controller 1020 may be an embodiment of system memory controller 920 as described with reference to FIG. 9. Memory devices 1080 may be an embodiment of memory devices 980 as described with reference to FIG. 9. Bus 1010 may be an embodiment of bus 910 as described with reference to FIG. 9.

In some embodiments, memory device 1080 may include a local memory controller 1081 and memory array 1082. Local memory controller 1081 may be an embodiment of local memory controller 981 as described with reference to FIG. 9. Memory array 1082 may be an embodiment of memory array 982 as described with reference to FIG. 9. In some embodiments, memory array 1082 may include 3D NAND memory cells or other kinds of non-volatile memory cells employing different non-volatile memory technologies than 3D NAND. In some embodiments, local memory controller 1081 may be configured to handle aspects of reset read operations. Local memory controller 1081 may be configured to operate with memory array 1082. In addition, local memory controller 1081 may be configured to operate with system memory controller 1020 via bus 1010-*b*.

In some cases, an apparatus may include a memory array, a processor, a controller coupled with the memory array and the processor, the controller being operable to identify a part of a read command for setting at least one portion of a memory array into a temporary state, identify the at least one portion of the memory array based at least in part on the part of the read command, and execute the part of the read command on the at least one portion of the memory array based at least in part on identifying the at least one portion of the memory array.

In some cases, executing the part of the read command may include performing a subset of a read operation, wherein the read operation comprises the subset and a data sense part. In some cases, the controller may be further operable to determine a number of portions on which the part of the read command is to be executed concurrently based at least in part on a product design identification of the memory array, wherein executing the part of the read command is based at least in part on determining the number of portions. In some cases, the controller may be further operable to receive a request from the processor to execute the part of the read command, wherein identifying the part of the read command is based at least in part on the received request.

In some cases, an apparatus may include a memory array, a processor, a controller coupled with the memory array and the processor, the controller being operable to initiate a reset read command that sets at least one portion of a memory array into a temporary state, increase a voltage applied to all word lines associated with the at least one portion to a first voltage above a threshold voltage of memory cells of the at least one portion based at least in part on the initiating, increase a voltage applied to at least one gate of at least one select gate device of the at least one portion to a second voltage above a second threshold voltage of the at least one select gate device based at least in part on the initiating, and set a node of the at least one portion to a third voltage based at least in part on the initiating.

In some cases, the reset read command that sets the at least one portion of the memory array into the temporary state may include initiating a transition of the at least one portion into the temporary state or maintaining the at least one portion in the temporary state. In some cases, the controller may be further operable to decrease the voltage applied to all word lines associated with the at least one portion from the first voltage to a fourth voltage based at least in part on achieving the first voltage, decrease the voltage applied to the at least one gate of the at least one select gate device of the at least one portion from the second voltage to below the second threshold voltage based at least in part on decreasing the voltage applied to all word lines, and the node may include a source, a drain, a bit line, or a combination thereof. In some cases, the controller may be further operable to identify a set feature and a trim condition associated with the reset read command, wherein the set feature and the trim condition are set by the processor, and determine a configuration for performing the reset read command based at least in part on identifying the set feature and the trim condition.

In some embodiments, memory array 1082 may include 3D NAND memory cells. In some embodiments, system memory controller 1020 may operate in conjunction with local memory controller 1081 to execute a reset read operation on one or more blocks of 3D NAND memory cells. In some embodiments, system memory controller 1020 may issue a single command to execute the reset read command according to certain set features and trim conditions and local memory controller 1081 may take over and perform the reset read command for memory array 1082 pursuant to the set features and the trim conditions. In some embodiments, local memory controller 1081 may keep track of when a read operation has been performed for each block of the memory array in memory array 1082 so as to assist system memory controller 1020 to issue a command to perform reset read operation.

Figure 11:
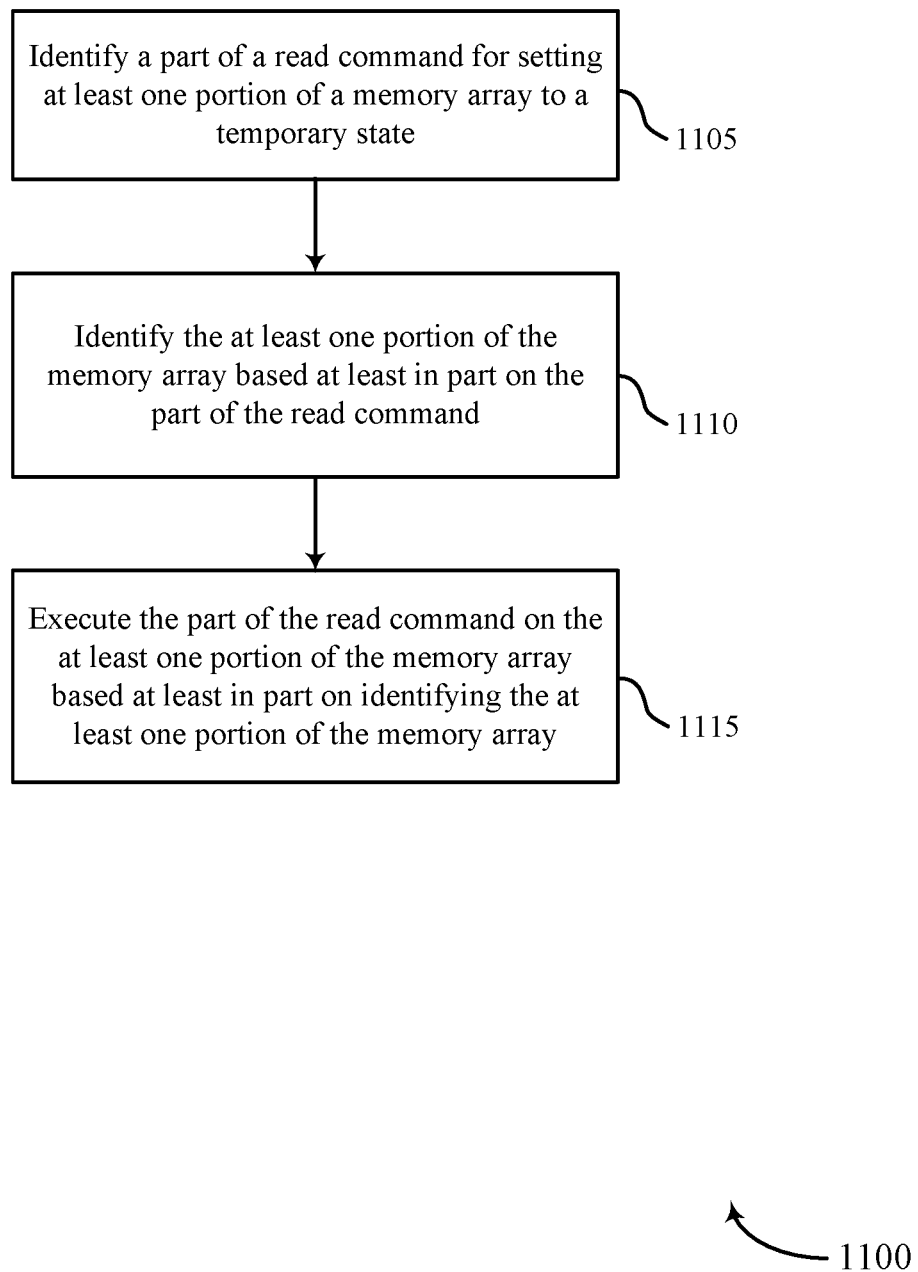
FIGS. 11-13 show flowcharts illustrating methods for memory array reset read operation in accordance with embodiments of the present disclosure.

FIG. 11 shows a flowchart illustrating a method 1100 for memory array reset read operation in accordance with embodiments of the present disclosure. The operation of method 1100 may be implemented by system memory controller 920 as described with reference to FIG. 9 or system memory controller 1020 as described with reference to FIG. 10. In some embodiments, system memory controller 1020 may identify and run a read recovery portion of a full read operation during a reset read operation. The full read operation may include additional portions associated with data sensing or transporting as described with respect to FIGS. 1 through 6. The full read operation may include the read recovery portion at the end the full read operation. In some cases, a reset read operation may be a subset of a full read operation. In some embodiments, system memory controller 1020 may determine to run a reset read operation based on a time duration since a last full read operation has been performed on one or more block because the blocks may have reverted to a stable state due to the time lapse. In some embodiments, a reset read operation may be configured to execute on one block at a time. In other embodiments, a reset read operation may be configured to execute on multiple blocks in parallel during overlapping or concurrent periods. The number of blocks to run a reset read operation may be determined by a calculator per a product design identification. The number may include a total number of blocks present in a 3D NAND memory device.

In some embodiments, various options for a reset read operation may be configured via one or more set features and/or one or more trim conditions. Combinations of the set features and the trim conditions may influence or determine a mode of the reset read operation. The set features may include indications for enabling a reset read command and performing the reset read command for a single block mode (i.e., executing a reset read operation for single block or single block on all plane if issued as multi-plane operation), a maximum block mode (i.e., executing a reset read operation on a maximum number of blocks in parallel as defined by a trim condition), an automatic mode (i.e., a memory device executing reset read operation automatically on a maximum number of blocks in parallel as defined by a trim condition for entire memory device), a post-erasure automatic mode (i.e., the automatic mode performed after an erasure operation is completed), and the like. The trim conditions may include indications for enabling the set features, defining a number of blocks to perform reset read operation, defining a time related to increasing a voltage applied for word lines associated with a maximum number of blocks, defining a time related to discharging word lines associated with a maximum number of blocks, and the like.

At block 1105, system memory controller 1020 may identify a part of a read command for setting at least one portion of a memory array to a temporary state. The operations of block 1105 may be performed according to the methods described with reference to FIGS. 1 through 10.

At block 1110, system memory controller 1020 may identify the at least one portion of the memory array based at least in part on the part of the read command. The operations of block 1110 may be performed according to the methods described with reference to FIGS. 1 through 10.

At block 1115, system memory controller 1020 may execute the part of the read command on the at least one portion of the memory array based at least in part on identifying the at least one portion of the memory array. The operations of block 1115 may be performed according to the methods described with reference to FIGS. 1 through 10.

In some cases, executing the part of the read command may include performing a read recovery part of a read operation, wherein the read operation comprises the read recovery part and a data sense part. In some cases, the method may further include increasing a voltage applied to all word lines associated with the at least one portion to a first voltage above a threshold voltage of memory cells of the at least one portion, increasing a voltage applied to at least one gate of at least one select gate device of the at least one portion to a second voltage above a second threshold voltage of the at least one select gate device, and setting a voltage applied to a source, a drain, a bit line, or a combination thereof, of the at least one portion to a third voltage. In some cases, the method may further include decreasing the voltage applied to all word lines from the first voltage to a fourth voltage based at least in part on achieving the first voltage, and decreasing the voltage applied to the at least one gate of the at least one select gate device from the second voltage to below the second threshold voltage based at least in part on decreasing the voltage applied to all word lines.

In some cases, the temporary state may include a transient state of memory cells of the at least one portion that includes retaining a word line to a channel potential difference of the memory cells at a level that is lower than a voltage of a source, a drain, a bit line, or a combination thereof of the memory cells after executing the part of the read command. In some cases, the method may further include determining a duration since a last read operation for the at least one portion, wherein identifying the at least one portion of the memory array is based at least in part on determining the duration. In some cases, the at least one portion corresponds to a single block of the memory array.

In some cases, the method may further include determining a mode of executing the part of the read command, wherein executing the part of the read command is based at least in part on determining the mode. In some cases, the method may further include identifying a product design identification of the memory array, wherein determining the mode comprises determining a number of portions of the memory array on which the part of the read command is to be executed based at least in part on the product design identification. In some cases, the method may further include executing the part of the read command concurrently on a plurality of portions of the memory array based at least in part on determining the number of portions. In some cases, the plurality of portions comprises a total number of blocks of the memory array.

In some cases, the memory array includes at least one three-dimensional Not-AND (NAND) memory cell. In some cases, the method may further include receiving a request to perform the read command, and initiating the part of the read command based at least in part on receiving the request. In some cases, the method may further include identifying a set feature and a trim condition associated with the part of the read command, and determining a configuration for executing the part of the read command based at least in part on identifying the set feature and the trim condition, where executing the part of the read command is based at least in part on determining the configuration.

In some cases, the set feature and the trim condition may include an execution of the part of the read command on a single block, an execution of the part of the read command on a maximum number of blocks defined by the trim condition, an automatic execution of the part of the read command, or a post-erase automatic execution of the part of the read command.

In some embodiments, an apparatus for memory array reset read operation is described. The apparatus may include means for identifying a part of a read command for setting at least one portion of a memory array to a temporary state, means for identifying the at least one portion of the memory array based at least in part on the part of the read command, and means for executing the part of the read command on the at least one portion of the memory array based at least in part on identifying the at least one portion of the memory array.

In some cases, the apparatus may further include means for increasing a voltage applied to all word lines associated with the at least one portion to a first voltage above a threshold voltage of memory cells of the at least one portion, means for increasing a voltage applied to at least one gate of at least one select gate device of the at least one portion to a second voltage above a second threshold voltage of the at least one select gate device, and means for setting a voltage applied to a source, a drain, a bit line, or a combination thereof, of the at least one portion to a third voltage. In some cases, the apparatus may further include means for decreasing the voltage applied to all word lines from the first voltage to a fourth voltage based at least in part on achieving the first voltage, and means for decreasing the voltage applied to the at least one gate of the at least one select gate device from the second voltage to below the second threshold voltage based at least in part on decreasing the voltage applied to all word lines.

In some cases, the apparatus may further include means for determining a duration since a last read operation for the at least one portion, wherein identifying the at least one portion of the memory array is based at least in part on determining the duration. In some cases, the apparatus may further include means for determining a mode of executing the part of the read command, wherein executing the part of the read command is based at least in part on determining the mode. In some cases, the apparatus may further include means for identifying a product design identification of the memory array, wherein determining the mode comprises determining a number of portions of the memory array on which the part of the read command is to be executed based at least in part on the product design identification. In some cases, the apparatus may further include means for executing the part of the read command concurrently on a plurality of portions of the memory array based at least in part on determining the number of portions.

In some cases, the apparatus may further include means for receiving a request to perform the read command, and means for initiating the part of the read command based at least in part on receiving the request. In some cases, the method may further include means for identifying a set feature and a trim condition associated with the part of the read command, and means for determining a configuration for executing the part of the read command based at least in part on identifying the set feature and the trim condition, where executing the part of the read command is based at least in part on determining the configuration.

Figure 12:
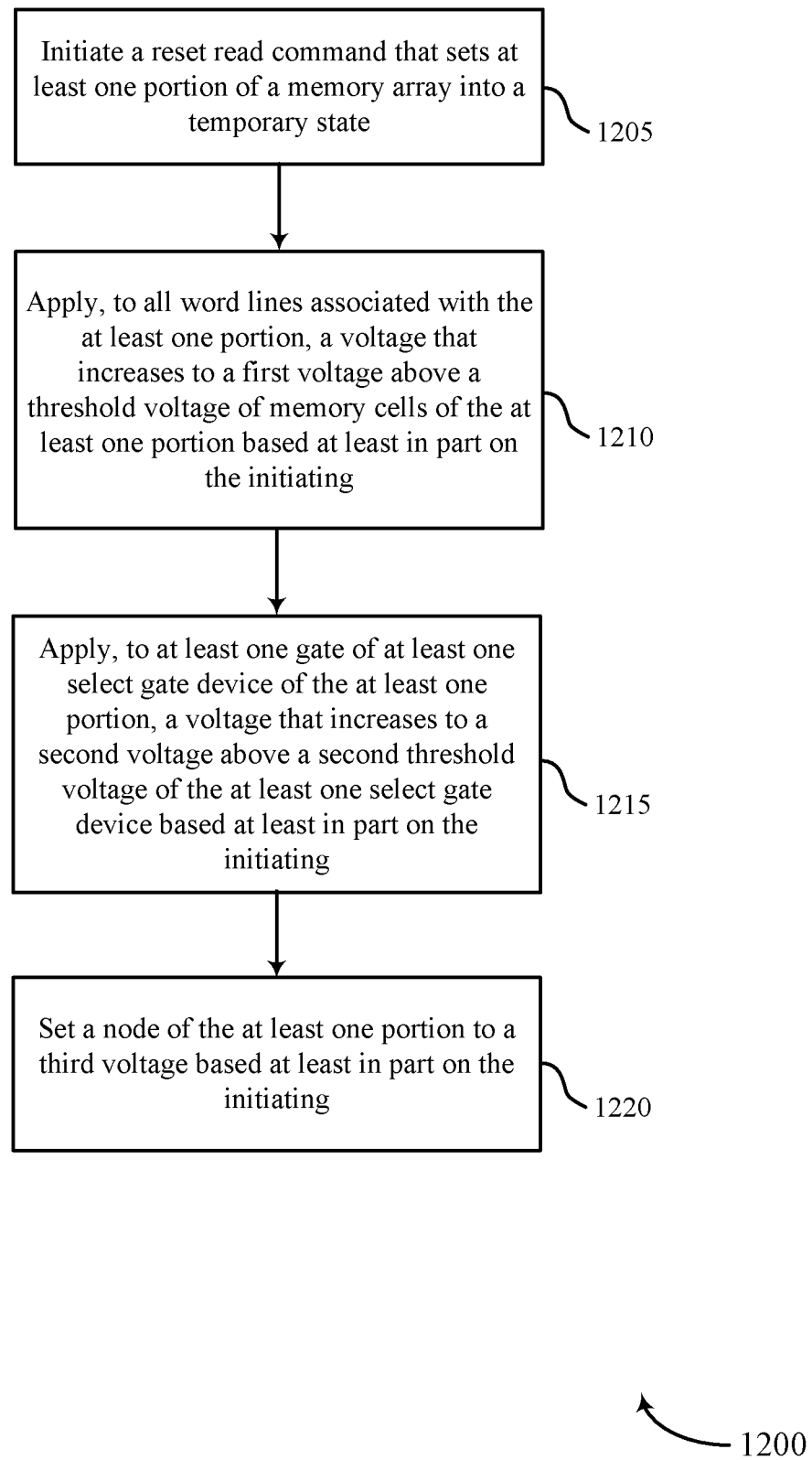

FIG. 12 shows a flowchart illustrating a method 1200 for memory array reset read operation in accordance with embodiments of the present disclosure. The operation of method 1200 may be implemented by system memory controller 920 as described with reference to FIG. 9 or system memory controller 1020 as described with reference to FIG. 10.

At block 1205, system memory controller 1020 may initiate a reset read command that sets at least one portion of a memory array into a temporary state. The operations of block 1205 may be performed according to the methods described with reference to FIGS. 1 through 10.

At block 1210, system memory controller 1020 may apply, to all word lines associated with the at least one portion, a voltage that increases to a first voltage above a threshold voltage of memory cells of the at least one portion based at least in part on the initiating. The operations of block 1210 may be performed according to the methods described with reference to FIGS. 1 through 10.

At block 1215, system memory controller 1020 may apply, to at least one gate of at least one select gate device of the at least one portion, a voltage that increases to a second voltage above a second threshold voltage of the at least one select gate device based at least in part on the initiating. The operations of block 1215 may be performed according to the methods described with reference to FIGS. 1 through 10.

At block 1220, system memory controller 1020 may set a node of the at least one portion to a third voltage based at least in part on the initiating. The operations of block 1220 may be performed according to the methods described with reference to FIGS. 1 through 10.

In some cases, the reset read command that sets the at least one portion of the memory array into the temporary state comprises initiating a transition of the at least one portion into the temporary state. In some cases, the reset read command that sets the at least one portion of the memory array into the temporary state comprises maintaining the at least one portion in the temporary state. In some cases, the node includes a source, a drain, a bit line, or a combination thereof. In some cases, the method may further include decreasing the voltage applied to all word lines associated with the at least one portion from the first voltage to a fourth voltage based at least in part on achieving the first voltage, and decreasing the voltage applied to the at least one gate of the at least one select gate device of the at least one portion from the second voltage to below the second threshold voltage based at least in part on decreasing the voltage applied to all word lines.

In some cases, the first voltage is higher than the second voltage, the second voltage is higher than the third voltage, and the third voltage is a ground potential. In some cases, the reset read command comprises a read recovery part of a read operation, the read operation comprises the read recovery part and a data sense and transfer part, and the read recovery part comprises applying the voltage that increases to the first voltage above the threshold voltage of the memory cells, applying the voltage that increases to the second voltage above the second threshold voltage of the at least one select gate device, and setting the node of the at least one portion to the third voltage.

In some embodiments, an apparatus for memory array reset read operation is described. The apparatus may include means for initiating a reset read command that sets at least one portion of a memory array into a temporary state, means for applying, to all word lines associated with the at least one portion, a voltage that increases to a first voltage above a threshold voltage of memory cells of the at least one portion based at least in part on the initiating, means for applying, to at least one gate of at least one select gate device of the at least one portion, a voltage that increases to a second voltage above a second threshold voltage of the at least one select gate device based at least in part on the initiating, and means for setting a node of the at least one portion to a third voltage based at least in part on the initiating.

In some cases, the apparatus may further include means for decreasing the voltage applied to all word lines associated with the at least one portion from the first voltage to a fourth voltage based at least in part on achieving the first voltage, and means for decreasing the voltage applied to the at least one gate of the at least one select gate device of the at least one portion from the second voltage to below the second threshold voltage based at least in part on decreasing the voltage applied to all word lines.

Figure 13:
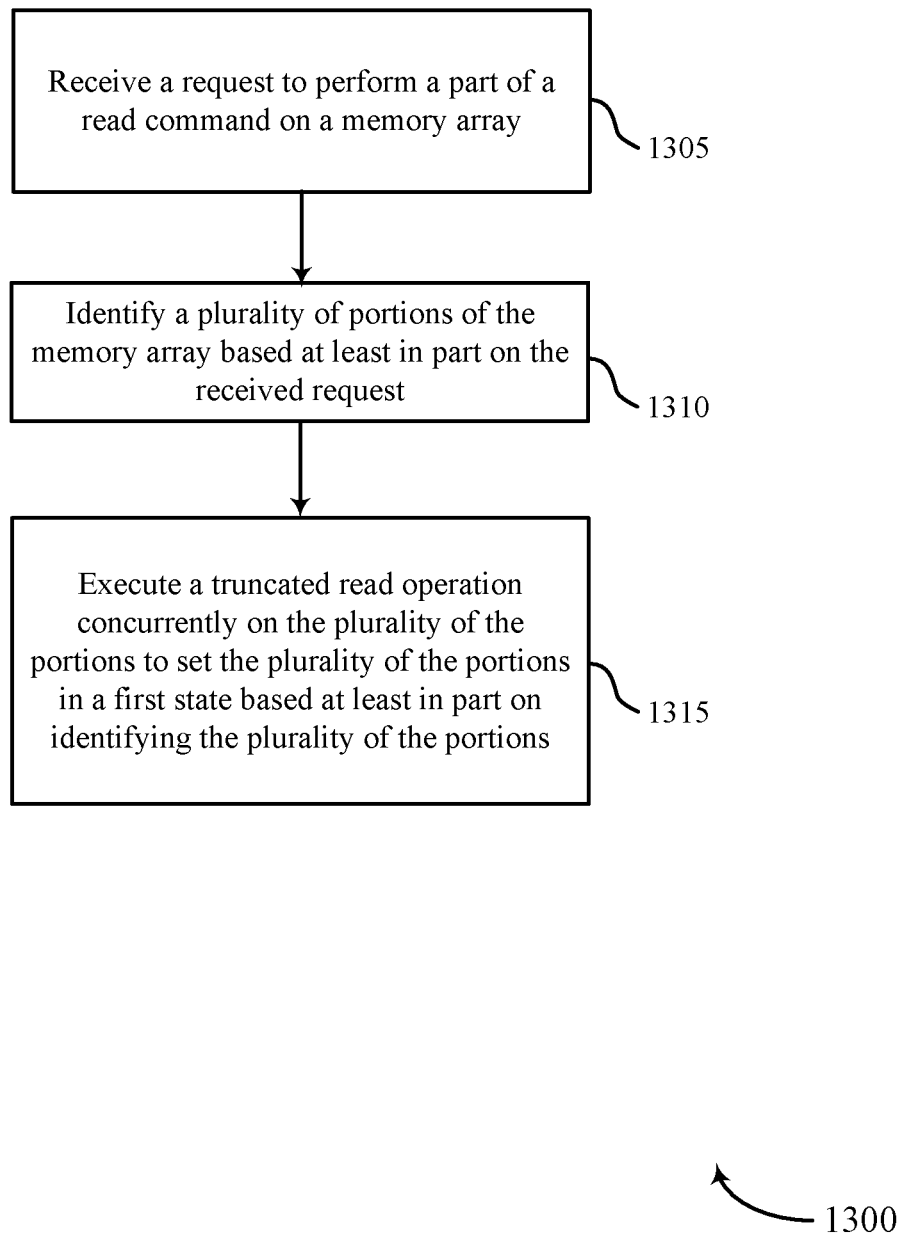

FIG. 13 shows a flowchart illustrating a method 1300 for memory array reset read operation in accordance with embodiments of the present disclosure. The operation of method 1300 may be implemented by system memory controller 920 as described with reference to FIG. 9 or system memory controller 1020 as described with reference to FIG. 10.

At block 1305, system memory controller 1020 may receive a request to perform a part of a read command on a memory array. The operations of block 1305 may be performed according to the methods described with reference to FIGS. 1 through 10.

At block 1310, system memory controller 1020 may identify a plurality of portions of the memory array based at least in part on the received request. The operations of block 1310 may be performed according to the methods described with reference to FIGS. 1 through 10.

At block 1315, system memory controller 1020 may execute a truncated read operation concurrently on the plurality of the portions to set the plurality of the portions in a first state based at least in part on identifying the plurality of the portions. The operations of block 1315 may be performed according to the methods described with reference to FIGS. 1 through 10.

In some cases, the method may further include determining the first state of the identified plurality of the portions based at least in part on the identifying the plurality of the portions, wherein executing the truncated read operation is based at least in part on determining the first state of the identified plurality of the portions. In some cases, executing the truncated read operation may include maintaining the plurality of the portions in the first state based at least in part on determining the first state of the identified plurality of the portions. In some cases, the method may further include selecting the truncated read operation, the truncated read operation being a part of a full read operation, wherein executing the truncated read operation is based at least in part on selecting the truncated read operation.

In some embodiments, an apparatus for memory array reset read operation is described. The apparatus may include means for receiving a request to perform a part of a read command on a memory array, means for identifying a plurality of portions of the memory array based at least in part on the received request, and means for executing a truncated read operation concurrently on the plurality of the portions to set the plurality of the portions in a first state based at least in part on identifying the plurality of the portions.

In some cases, the apparatus may further include means for determining the first state of the identified plurality of the portions based at least in part on the identifying the plurality of the portions, wherein executing the truncated read operation is based at least in part on determining the first state of the identified plurality of the portions. In some cases, the apparatus may further include means for selecting the truncated read operation, the truncated read operation being a part of a full read operation, wherein executing the truncated read operation is based at least in part on selecting the truncated read operation.

It should be noted that the methods described above describe possible implementations, and that the operations and the steps may be rearranged or otherwise modified and that other implementations are possible. Furthermore, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes embodiment configurations and does not represent all the embodiments that may be implemented or that are within the scope of the claims. The term "exemplary" used herein means "serving as an embodiment, instance, or illustration," and not "preferred" or "advantageous over other embodiments." The detailed description includes specific details for the purpose of providing an understanding of the described techniques. These techniques, however, may be practiced without these specific details. In some instances, well-known structures and devices are shown in block diagram form in order to avoid obscuring the concepts of the described embodiments.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other embodiments and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the embodiments and designs described herein, but is to be accorded the broadest scope consistent with the principles and novel features disclosed herein.

What is claimed is:

1. An apparatus, comprising:
a memory device; and
a controller coupled with the memory device and configured to cause the apparatus to:
identify a command to perform a reset read operation for setting at least one portion of a memory array to a transient state;
identify the at least one portion of the memory array based at least in part on the command; and
execute the reset read operation on the at least one portion of the memory array based at least in part on identifying the at least one portion of the memory array, wherein executing the reset read operation comprises performing a read recovery part of a read operation,
and wherein the transient state of memory cells of the at least one portion of the memory array that includes retaining a word line to a channel potential difference of the memory cells at a level that is lower than a voltage of a source, a drain, a bit line, or a combination thereof of the memory cells after executing the reset read operation.

2. The apparatus of claim 1, wherein the read operation comprises the read recovery part and a data sense part, and wherein the read recovery part of the read operation sets the at least one portion of the memory array to the transient state.

3. The apparatus of claim 1, wherein the controller is configured to cause the apparatus to:
increase a voltage applied to one or more word lines associated with the at least one portion of the memory array to a transient voltage above a threshold voltage of memory cells of the at least one portion of the memory array;
increase a voltage applied to at least one gate of at least one select gate device of the at least one portion of the memory array to a second voltage above a second threshold voltage of the at least one select gate device; and
set a voltage applied to a source, a drain, a bit line, or a combination thereof, of the at least one portion of the memory array to a third voltage.

4. The apparatus of claim 3, wherein the controller is configured to cause the apparatus to:
decrease the voltage applied to the one or more word lines from the transient voltage to a fourth voltage based at least in part on achieving the transient voltage; and
decrease the voltage applied to the at least one gate of the at least one select gate device from the second voltage to below the second threshold voltage based at least in part on decreasing the voltage applied to the one or more word lines.

5. The apparatus of claim 1, wherein the controller is configured to cause the apparatus to:
determine a duration since a last read operation for the at least one portion of the memory array, wherein identifying the at least one portion of the memory array is based at least in part on determining the duration.

6. The apparatus of claim 1, wherein the at least one portion of the memory array corresponds to a single block of the memory array.

7. The apparatus of claim 1, wherein the controller is configured to cause the apparatus to:
determine a mode of executing the reset read operation, wherein executing the reset read operation is based at least in part on determining the mode.

8. The apparatus of claim 7, wherein the controller is configured to cause the apparatus to:
identify a product design identification of the memory array, wherein determining the mode comprises determining a quantity of portions of the memory array on which the reset read operation is to be executed based at least in part on the product design identification.

9. The apparatus of claim 8, wherein the controller is configured to cause the apparatus to:
execute the reset read operation concurrently on a plurality of portions of the memory array based at least in part on determining the quantity of portions.

10. The apparatus of claim 9, wherein the plurality of portions comprises a total quantity of blocks of the memory array.

11. The apparatus of claim 1, wherein the memory array comprises:
at least one three-dimensional Not-AND (NAND) memory cell.

12. The apparatus of claim 1, wherein the controller is configured to cause the apparatus to:
receive a request to perform the reset read operation; and
initiate the reset read operation based at least in part on receiving the request.

13. The apparatus of claim 12, wherein the controller is configured to cause the apparatus to:
identify a set feature and a trim condition associated with the reset read operation; and
determine a configuration for executing the reset read operation based at least in part on identifying the set feature and the trim condition, wherein executing the reset read operation is based at least in part on determining the configuration.

14. The apparatus of claim 13, wherein the set feature and the trim condition comprise an execution of the reset read operation on a single block.

15. The apparatus of claim 13, wherein the set feature and the trim condition comprises an execution of the reset read operation on a maximum quantity of blocks defined by the trim condition.

16. The apparatus of claim 13, wherein the set feature and the trim condition comprise an automatic execution of the reset read operation.

17. A non-transitory computer-readable medium storing code comprising instructions which, when executed by a processor of an electronic device, cause the electronic device to:
identify a command to perform a reset read operation for setting at least one portion of a memory array into a transient first state;
identify the at least one portion of the memory array based at least in part on the part on the command; and
execute the reset read operation on the at least one portion of the memory array based at least in part on identifying the at least one portion of the memory array, wherein executing the reset read operation comprises performing a read recovery part of a read operation,
and wherein the transient state of memory cells of the at least one portion of the memory array that includes retaining a word line to a channel potential difference of the memory cells at a level that is lower than a voltage of a source, a drain, a bit line, or a combination thereof of the memory cells after execution of the reset read operation.

18. The non-transitory computer-readable medium of claim 17, wherein the instructions, when executed by the processor of the electronic device, further cause the electronic device to:
determine a quantity of portions of the memory array on which the reset read operation is to be executed concurrently based at least in part on a product design identification of the memory array, wherein executing the command to perform the reset read operation is based at least in part on determining the quantity of portions of the memory array.

19. A method, comprising:
identifying a command to perform a reset read operation for setting at least one portion of a memory array into a transient state;
identifying the at least one portion of the memory array based at least in part on the part on the command; and
executing the reset read operation on the at least one portion of the memory array based at least in part on identifying the at least one portion of the memory array, wherein executing the reset read operation comprises performing a read recovery part of a read operation, and wherein the transient state of memory cells of the at least one portion of the memory array that includes retaining a word line to a channel potential difference of the memory cells at a level that is lower than a voltage of a source, a drain, a bit line, or a combination thereof of the memory cells after execution of the reset read operation.

20. The method of claim 19, further comprising:
determining a quantity of portions of the memory array on which the reset read operation is to be executed concurrently based at least in part on a product design identification of the memory array, wherein executing the command to perform the reset read operation is based at least in part on determining the quantity of portions of the memory array.

* * * * *